United States Patent
Chiang

(10) Patent No.: US 12,211,574 B2
(45) Date of Patent: Jan. 28, 2025

(54) METHOD FOR ERROR CORRECTION CODING WITH MULTIPLE HASH GROUPINGS AND DEVICE FOR PERFORMING THE SAME

(71) Applicant: Taiwan Semiconductor Manufacturing Company Limited, Hsinchu (TW)

(72) Inventor: Katherine H. Chiang, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 141 days.

(21) Appl. No.: 18/121,168

(22) Filed: Mar. 14, 2023

(65) Prior Publication Data

US 2023/0214296 A1 Jul. 6, 2023

Related U.S. Application Data

(63) Continuation of application No. 17/460,359, filed on Aug. 30, 2021, now Pat. No. 11,610,640.

(51) Int. Cl.
*G11C 29/42* (2006.01)
*G06F 11/07* (2006.01)
*G06F 11/10* (2006.01)
*G11C 7/10* (2006.01)
*G11C 29/18* (2006.01)

(52) U.S. Cl.
CPC .......... *G11C 29/42* (2013.01); *G06F 11/0793* (2013.01); *G06F 11/1016* (2013.01); *G06F 11/1068* (2013.01); *G11C 7/1057* (2013.01); *G11C 7/1084* (2013.01); *G11C 29/18* (2013.01)

(58) Field of Classification Search
CPC ....... G11C 29/42; G11C 29/18; G11C 7/1057; G11C 7/1084; G06F 11/0793; G06F 11/1016; G06F 11/1068
See application file for complete search history.

(56) References Cited

U.S. PATENT DOCUMENTS

| | | |
|---|---|---|
| 7,656,322 B2 | 2/2010 | Oda |
| 9,323,608 B2 | 4/2016 | Troia |
| 9,384,083 B2 | 7/2016 | Fujiwara et al. |
| 9,619,318 B2 * | 4/2017 | Leininger ......... H03M 13/2906 |
| 9,928,140 B2 | 3/2018 | Sunwoo |
| 10,573,356 B2 | 2/2020 | Cha et al. |
| 10,671,477 B2 | 6/2020 | Kim |

* cited by examiner

*Primary Examiner* — Son L Mai
(74) *Attorney, Agent, or Firm* — The Marbury Law Group, PLLC

(57) ABSTRACT

Various aspects include methods and devices for implementing the methods for error checking a memory system. Aspects may include receiving, from a row buffer of a memory, access data corresponding to a column address of a memory access, in which the row buffer has data of an activation unit of the memory corresponding to a row address of the memory access, determining multiple error correction codes (ECCs) for the access data using the column address, and checking the access data for an error utilizing at least one of the multiple ECCs. In some aspects, the multiple ECCs may include a first ECC having data from an access unit of the memory corresponding with the column address, and at least one second ECC having data from the access unit and data from the activation unit other than from the access unit.

20 Claims, 23 Drawing Sheets

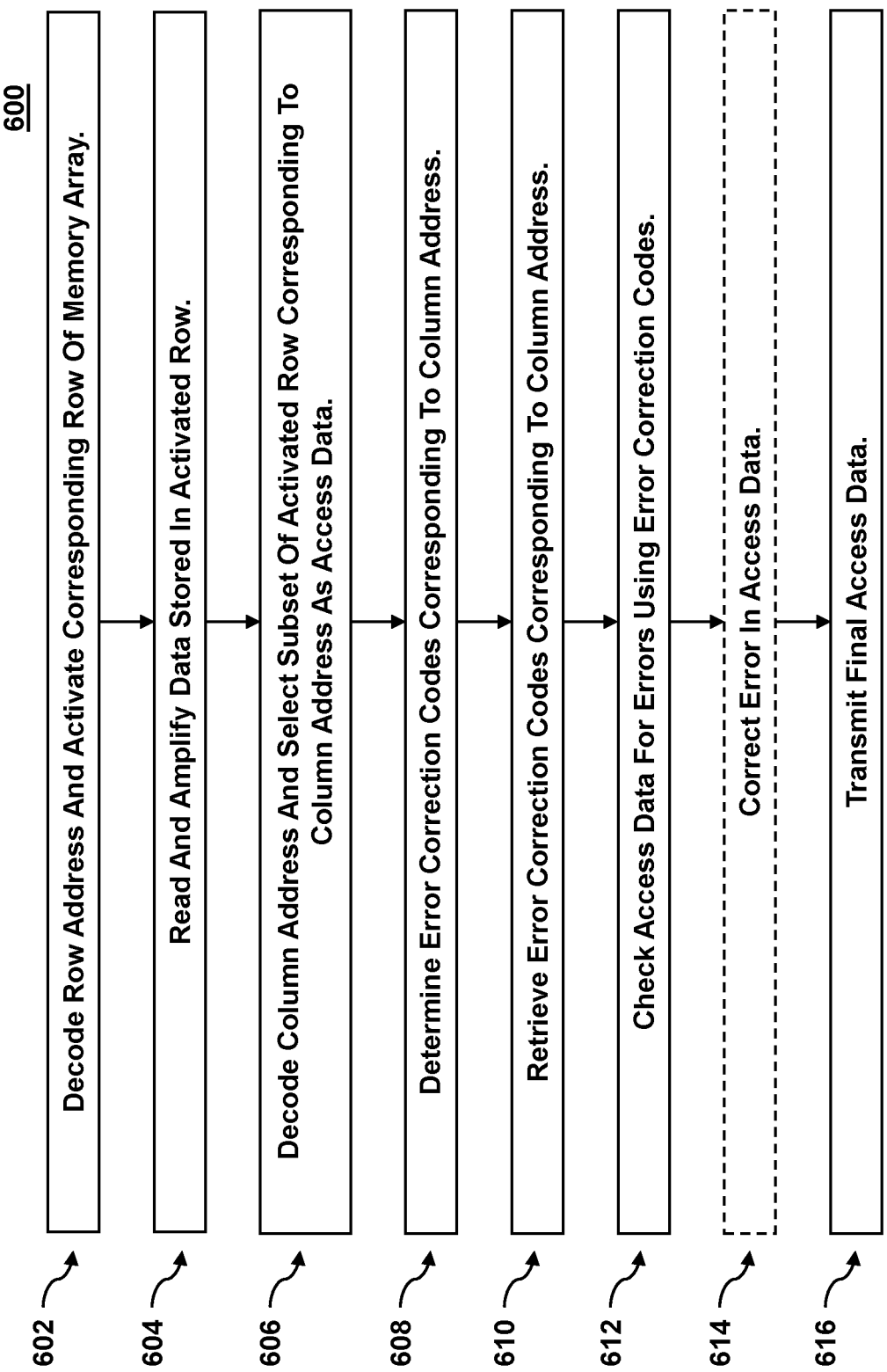

METHOD FOR ERROR CORRECTION CODING WITH MULTIPLE HASH GROUPINGS AND DEVICE FOR PERFORMING THE SAME

RELATED APPLICATIONS

This application is a continuation U.S. Non-provisional patent application Ser. No. 17/460,359 entitled "Method for Error Correction Coding with Multiple Hash Groupings and Device for Performing the Same" filed Aug. 30, 2021, the entire contents of which are incorporated herein by reference for all purposes.

BACKGROUND

An error correction code (ECC)-enabled memory device generally refers to a memory device that includes additional information, called an ECC or ECC bits (e.g., "parity bits"), stored in the memory device in addition to actual data bits. ECCs are used to check consistency of the data bits when the data bits are read from the memory device. In general, using the ECC, corruption (e.g., errors) of data bits can be detected and the corrupted data bits can be corrected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a process flow diagram of a method of error correction coding with multiple ECC grouping according to an embodiment.

DETAILED DESCRIPTION

Figure 1:
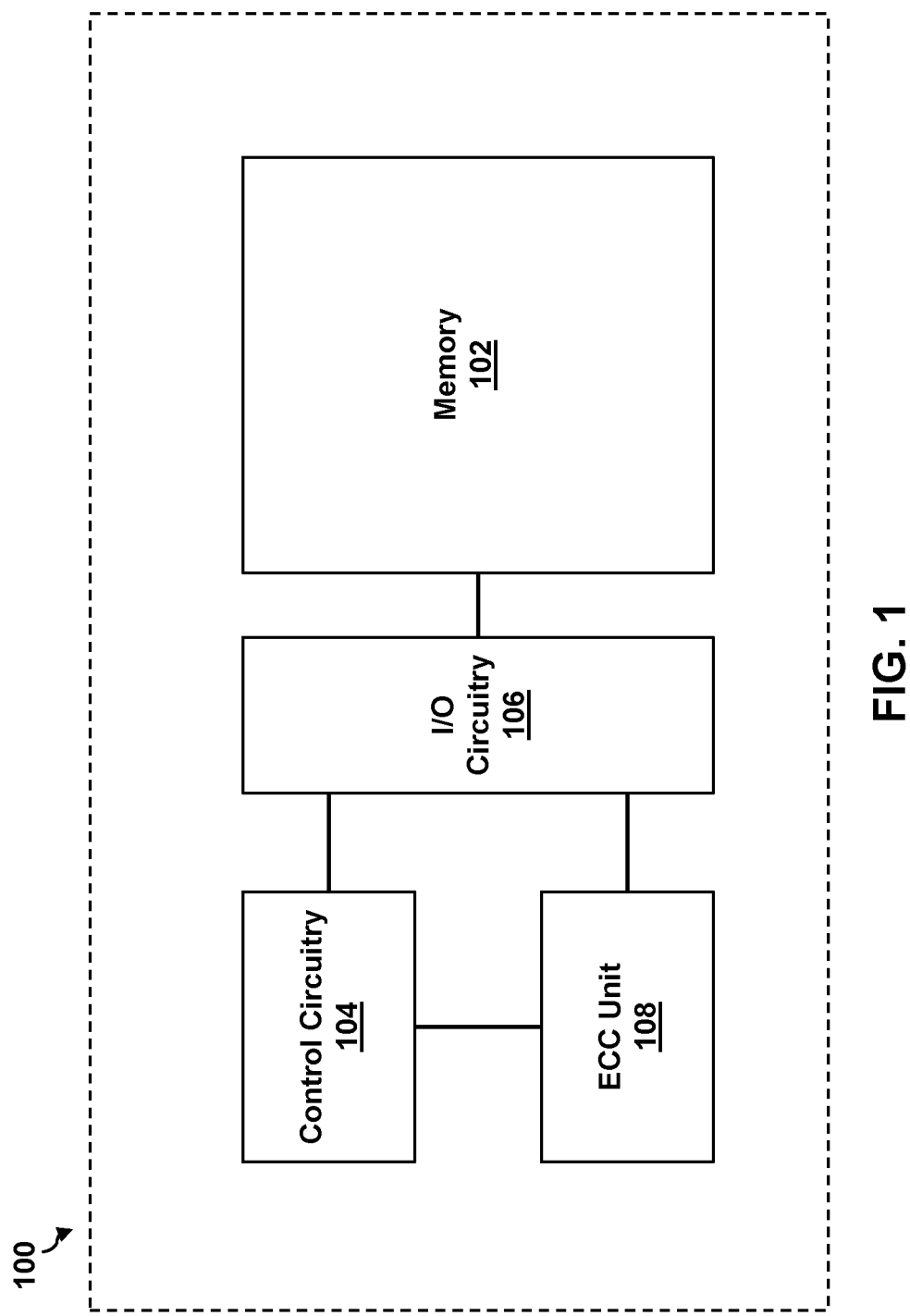
FIG. 1 is a component block diagram of a memory system suitable for implementing various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first element, component, and/or feature over or on a second element, component, and/or feature in the description that follows may include embodiments in which the first and second elements, components, and/or feature are formed in direct contact, and may also include embodiments in which additional elements, components, and/or feature are formed between the first and second features, such that the first and second elements, components, and/or feature are not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element's, component's, and/or feature's relationship to another element(s), component(s), and/or feature(s) as illustrated in the Figures. The spatially relative terms are intended to encompass different orientations of the device in use or operation in addition to the orientation depicted in the Figures. The apparatus and/or device may be otherwise oriented (rotated 90 degrees or at other orientations) and the spatially relative descriptors used herein may likewise be interpreted accordingly. Unless explicitly stated otherwise, each element, component, and/or feature having the same reference numeral is presumed to have the same material composition and to have a thickness within a same thickness range.

The terms "processor," "processor core," "controller," and "control unit" are used interchangeably herein, unless otherwise noted, to refer to any one or all of a software-configured processor, a hardware-configured processor, a general purpose processor, a dedicated purpose processor, a single-core processor, a homogeneous multi-core processor, a heterogeneous multi-core processor, a core of a multi-core processor, a microprocessor, a central processing unit (CPU), a graphics processing unit (GPU), a digital signal processor (DSP), etc., a controller, a microcontroller, a field programmable gate array (FPGA), an application-specific integrated circuit (ASIC), other programmable logic devices, discrete gate logic, transistor logic, and the like. A processor may be an integrated circuit, which may be configured such that the components of the integrated circuit reside on a single piece of semiconductor material, such as silicon.

As electronic memories get larger, the probability of an error occurring within the memory increases. Errors in a memory may be classified into two categories: hard and soft. Hard errors may be the result of defects in the actual physical structure of the memory, such as a faulty capacitor or transistor. Soft errors may be the result of glitches induced by error sources such as alpha particles, gamma rays, radiation, electrical noise, and so forth. Soft error may be thought of as being transient in nature.

There are several different ways to detect and correct errors. A first method involves the use of a parity bit per group of memory bits. For example, a single parity bit may be used to cover an eight-bit group (a byte) of memory values. One way to use the parity bit is to perform a count of the number of bits in the byte with values equal to one. In response to the count being an odd number, the parity bit may be set to one. In response to the count being an even number, the parity bit may be set to zero. Parity bits, however, can only be used to detect the presence of an error, they cannot correct which specific bit is in error.

More sophisticated methods are available that may detect and correct errors. These methods typically use error correction codes (ECC). For example, more than one parity bit per group of memory bits that they are protecting are used. The error correction may include a two-step process. First, an error is detected. Second, the error is corrected. Detection and correction of errors in memory may occur when information is read from a memory location. When the information is read from the memory location, error detecting hardware can be used to determine if an error has occurred. In response to detecting that an error has occurred, the information as read from the memory location may be corrected (in many instances, the circuitry that detected the error can automatically correct the error). Not all errors are correctable using current available methods for error detection and correction.

Transient and stochastic, or random, errors in memory cannot be effectively repaired with existing error detection and correction methods (e.g., redundancy, which may provide a backup preserved to replace hard fail bits, or the above described uses of parity bits). The challenge of error detection and correction becomes increasingly critical and difficult with increasing variation among memory cells as size continues to shrink, and emerging memories using magnetic and/or ferroelectric properties exhibit new kinds of transient errors that are stochastic beyond electrical control (e.g., errors not from leakage in dynamic random-access-memory (DRAM), which can be effectively remedied by refresh). Error detection and correction algorithms where each bit is only covered by one ECC (e.g., one ECC of multiple parity bits) have limited error detection or correction capability. Further, collisions of multiple error patterns unrecognizable to the detection or correction algorithms can occur, for which the detection or correction algorithms will not work.

Embodiments described herein overcome the foregoing limitations of existing error detection and correction methods by effectively increasing the error detection and correction capacity without introducing more complex error detection and correction algorithms, which are normally more computing and parity bits-demanding. The embodiments described herein provide a multi-level scheme, in which each bit of the memory is associated with more than one ECC, which may be grouped as ECC groups. The ECCs may be designed to use data available from an activation unit (e.g., a page in DRAM), driven in response to a memory access for an access unit subset of the activation unit, to leverage that all data within the activation unit are readily available without extra energy or latency consumption for the memory access. Each ECC for a bit of an access unit may be a combination of bits of the activation unit of which the access unit is a subset.

An ECC group may indicate the ECCs associated with a bit of the memory. An ECC group function may be used to generate the ECC group for the memory bit. The ECC group function may be any number and combination of functions that may generate a single output as an ECC group or multiple outputs combined as an ECC group. The ECC group function may use an address of a memory access as an input to the ECC group function to determine the ECC group for the data of the memory access.

The embodiments described herein may increase transient and stochastic fault correction capacity in memory over existing error detection and correction schemes by having each memory bit secured by multiple ECCs. Increasing the transient and stochastic fault correction capacity may be achieved with fewer absolute numbers of parity bits by having each memory bit secured by multiple parities calculated from different ECCs (of different sizes and environments), rather than parities all derived from the same ECC. The concept is that: if a hint, or a parity bit, from one ECC is not enough to correct an error of a memory bit, another hint for correction of the error may be extracted from other ECCs.

The embodiments described herein may improve performance over existing error detection and correction schemes, such as reducing latency by adopting a less complex error correction algorithm. For example, the embodiments described herein may implement an error correction algorithm using smaller ECCs (e.g., using fewer parity bits per ECC).

The embodiments described herein may be technology-agnostic, and compatible with existing memory designs and error detection and correction algorithms. The existing algorithms for error correction (e.g., Hamming, Bose-Chaudhuri-Hocquenghem (BCH), low-density parity-check (LDPC), etc.) and error detection may be used with the ECC group function to determine ECC groups and their multiple ECCs.

FIG. 1 illustrates an example block diagram of a memory system 100 suitable for implementing various embodiments. While FIG. 1 illustrates one example of a memory system, one skilled in the art may recognize that additional components and/or elements may be added and existing components and/or element may be removed. Similarly, any such additional and existing components and/or elements may be combined and/or otherwise arranged. Additionally, the memory system 100 may form part of or be integrated in another computing device or system, examples of which are described below with reference to FIGS. 8-10.

As illustrated in FIG. 1, the memory system 100 may include a memory 102, a control circuitry 104, input/output (I/O) circuitry 106, and an error correction code (ECC) unit 108. In some embodiments, the components of the memory system 100 (e.g., the memory 102, the control circuitry 104, the I/O circuitry 106, the ECC unit 108, etc.) may be coupled to one another. In some embodiments, the ECC unit 108 may include hardware, software, or combination thereof to perform processes of identifying errors in data retrieved from the memory 102 and to potentially correct the errors.

In some embodiments, the memory 102 may include one or more memory arrays that may be configured to store data, as described below in further detail, for example, with references to FIGS. 2A and 3B. The memory array of the memory 102 may include a plurality of memory cells arranged in an array, where the cells may each be a volatile memory cell, such as a dynamic random-access-memory (DRAM) cell, a static random-access-memory (SRAM), or a non-volatile memory, such as a ferroelectric random-access-memory (FeRAM) cell, a resistive random-access-memory (RRAM) cell, a magnetoresistive random-access-memory (MRAM) cell, a phase-change random-access-memory (PCRAM) cell, etc.

In some embodiments, each of the plurality of memory cells may be configured to be written and read. For example, the I/O circuit 106, which may include a plurality of drivers (e.g., word line drivers, bit line drivers, etc.), sensing circuits (e.g., sensing amplifiers etc.), and other logic circuits (e.g., transmission gates, switches, multiplexers, etc.), may be configured to access the plurality of memory cells of the memory 102. The control circuitry 104 may be configured to control the I/O circuit 106 to write data bits into respective cells of the memory 102 and read data bits present at respective cells of one or more memory arrays of the memory 102.

In some embodiments, the ECC unit 108 may be configured to implement error detection and correction. The ECC unit 108 can be configured to utilize any type of error correction algorithm, process, or code, for example, Hamming codes, Hsiao codes, Reed-Solomon codes, Bose-Chaudhuri-Hocquenghem (BCH) codes, turbo codes, low-density-parity-check codes, etc. The ECC unit 108 may utilize the ECCs to detect one or more errors of data bits for a read memory access of the memory 102 and further attempt to correct the one or more errors.

Figure 2A:
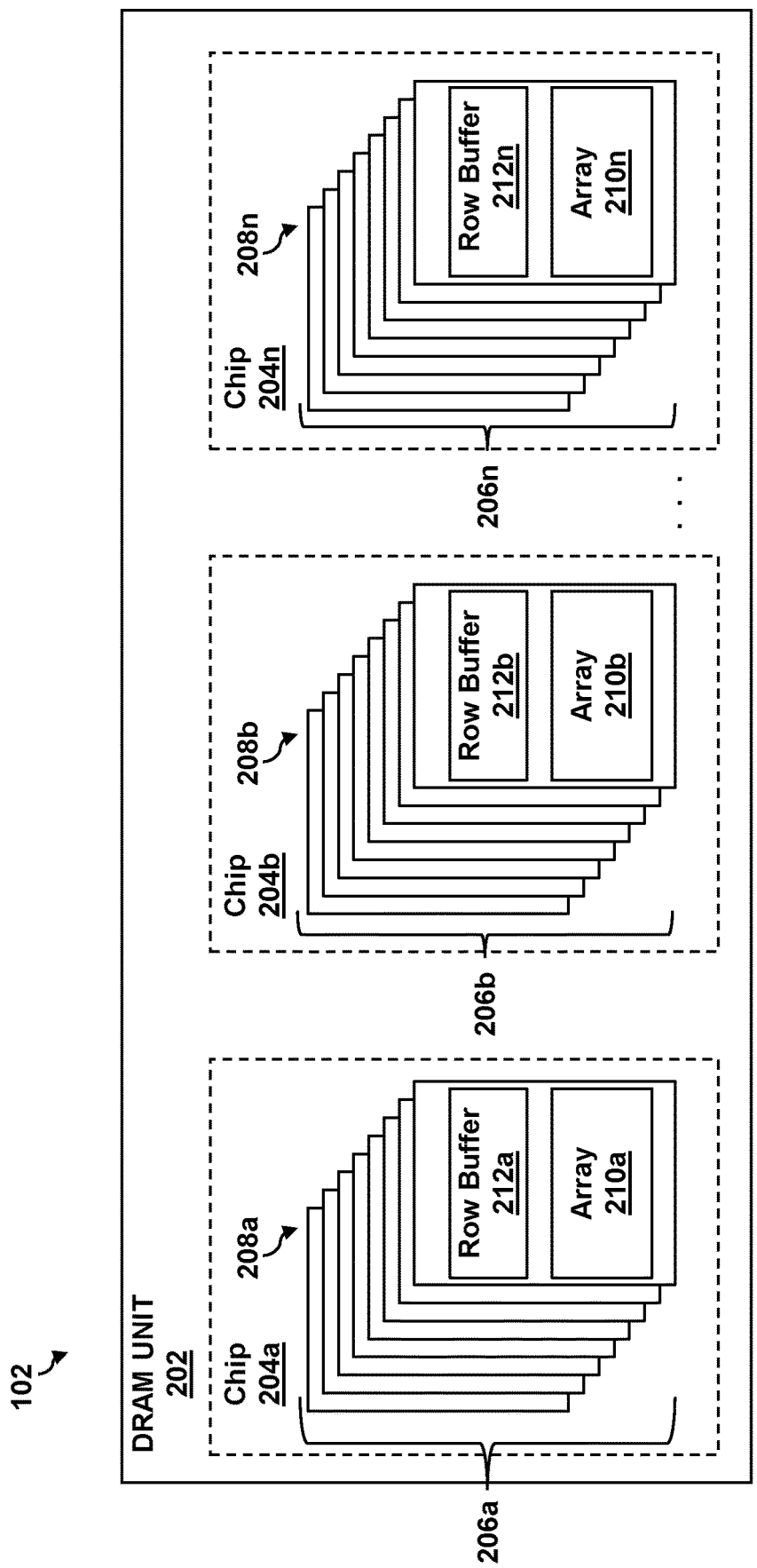
FIG. 2A is a component block diagram of a dynamic random-access-memory (DRAM) unit suitable for implementing various embodiments.

FIG. 2A is a diagram that illustrates an example of a DRAM unit 202 suitable for implementing various embodiments. With reference to FIGS. 1 and 2A, in some embodiments, one or more of the DRAM unit 202 may be utilized as the memory 102 in the memory system 100. While FIG. 2A illustrates one example of a memory 102, such as the DRAM unit 202, one skilled in the art may recognize that additional component and/or elements may be added and existing components and/or element may be removed. Similarly, any such additional and existing components and/or elements may be combined and/or otherwise arranged. Other memory units using other memory technologies may be implemented with the embodiment methods disclosed herein.

As illustrated in FIG. 2A, the DRAM unit 202 may include any number of DRAM chips 204a-204n. For example, the DRAM unit 202 may include eight (8) DRAM chips. Each of the DRAM chips 204a-204n may include a memory unit 208a-208n having any number of banks 206a-206n. For example, a memory unit 208a-208n may include eight (8) banks 206a-206n. Each of the banks 206a-206n may include a memory array 210a-210n and a row buffer 212a-212n. Each memory array 210a-210n may include individual memory cells, arranged in columns and rows, configured to store data. Each of the banks 206a-206n may include a row buffer 212a-212n configured to temporarily store data being read out from a row of memory cells of the memory array 210a-210n, as described further herein with reference to FIG. 2B. The row buffer 212a-212n may store data being read out from a row of memory cells until a read memory access is complete. In some embodiments, a single bank of each group of banks 206a-206n may be implemented across multiple DRAM chips 204a-204n. In other words, a single bank may be part of multiple groups of banks 206a-206n. As such, a memory array 210a-210n and a row buffer 212a-212n for the bank 206a-206n may also be implemented across the multiple DRAM chips 204a-204n.

Figure 2B:
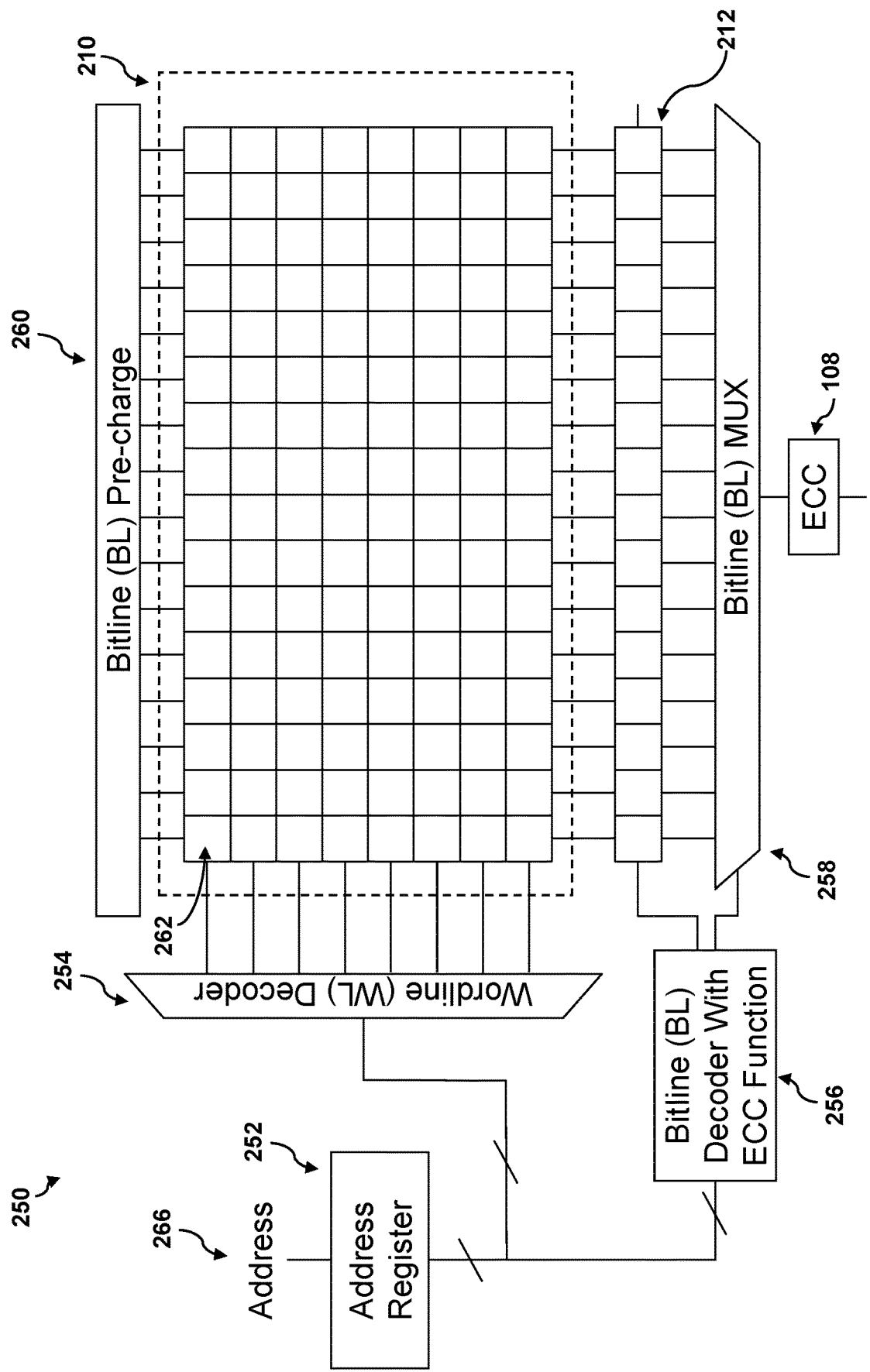
FIG. 2B is a component block diagram of a memory chip suitable for implementing various embodiments.

FIG. 2B is a diagram that illustrates an example of a memory device 250. With reference to FIGS. 1-2B, in some embodiments, the memory device 250 may be any bank of the groups of banks 206a-206n. The memory device 250 may include the memory array 210 (e.g., any of memory array 210a-210n) and the row buffer 212 (e.g., any of row buffer 212a-212n) of the bank of the groups of banks 206a-206n. In some embodiments, the bank of the groups of banks 206a-206n may be implemented across multiple DRAM chips 204a-204n. For example, a row of the memory array 210 may include portions from a corresponding row of each of the memory arrays 210a-210n. Similarly, the row buffer 212 may include portions from the row buffers 212a-212n. The memory array 210 may include an array of memory cells 262, with each memory cell 262 having an address corresponding to a row and a column of the memory array 210. The memory device 250 may include a wordline decoder 254 coupled to the memory cells 262 via word line electrical conduits (word lines), and the row buffer 212 and a bitline pre-charge 260 coupled to the memory cells 262 via bit line electrical conduits (bit lines).

The memory device 250 may include an address register 252. The wordline decoder 254 and a bitline decoder 256 may be coupled to the address register 252. The address register 252 may be configured to receive an address 266 for a memory access for reading from and/or writing to a memory cell 262. The address 266 may be a multi-bit address for which different bits may be configured to indicate to the memory device 250 a row address and a column address of the memory cell 262 subject to the memory access. The wordline decoder 254 and the bitline decoder 256 may be configured to receive parts of the address 266 that correspond to a memory cell 262 in the memory array 210. The wordline decoder 254 may include voltage and current sources (used in the reading/writing/refreshing operations) that apply a voltage and/or current to a row of the memory cells 262 corresponding to the received portion of the address 266, the row address.

The bitline pre-charge 260 may apply a voltage and/or current to the bit lines and the row buffer 212 to equalize voltage across in preparation for a memory access. The row buffer 212 may include sense amplifiers, used to detect and amplify the charge stored in the memory cells 262 representing data. The data of the row of memory cells 262 corresponding to the row address may be amplified and read out by the row buffer 212. In some embodiments, the row buffer 212 may store data from any number and combination of rows. For example, the row buffer 212 may store data from a single row buffer at a time.

The bitline decoder 256 may be coupled to the row buffer 212 and a bitline multiplexer 258. The bitline decoder 256 may be configured to control the bitline multiplexer 258 to select and output data from a portion of the row buffer 212 corresponding to a column of the memory cells 262. The column of memory cells 262 may correspond to the portion of the address 266 received by the bitline decoder 256, the column address. The data output by the bitline multiplexer 258 may correspond to a memory cell 262 at an intersection of the row address of the memory cells 262 and the column address of the memory cells 262.

In DRAM, a memory element (for example, memory cell 262) may include a capacitor (not illustrated) to store a charge that represents a single bit of information. For example, if the capacitor is full (or near full) of charge, then it may be holding a binary one and if the capacitor is empty (or near empty) of charge, then it may be holding a binary zero. A transistor (not illustrated), with its gate coupled to a word line, may operate as a switch to permit detecting (reading) and placing (writing) a charge stored on the capacitor. To access the memory device 250, the transistor of the memory cell 262 may be turned on by the word line. A charge stored on the capacitor becomes distributed on a bit line and creates a voltage difference between the charge of the capacitor and a reference voltage, which was the initial value of the bit line provided by the bitline pre-charge 260. A sense amplifier of the row buffer 212 having a first input coupled to the bit line and a second input coupled to the reference voltage, can be used to determine the information stored in the capacitor by detecting the voltage difference on the bit line when compared to the reference voltage.

The bitline decoder 256 may be further configured with an ECC function configured to determine ECC groups for the data retrieved from the memory cell 262 at the address 266. As described further herein, the bitline decoder 256 may determine the columns addresses for the ECCs of the ECC groups. Using the columns addresses of the ECCs, the bitline decoder 256 may control the bitline multiplexer 258 to select and output the ECCs from the data of the same row address read out by the row buffer 212 for the memory access. The memory device 250 may output the data retrieved for the memory access and the ECCs retrieved for the data to the ECC unit 108.

Figure 3A:
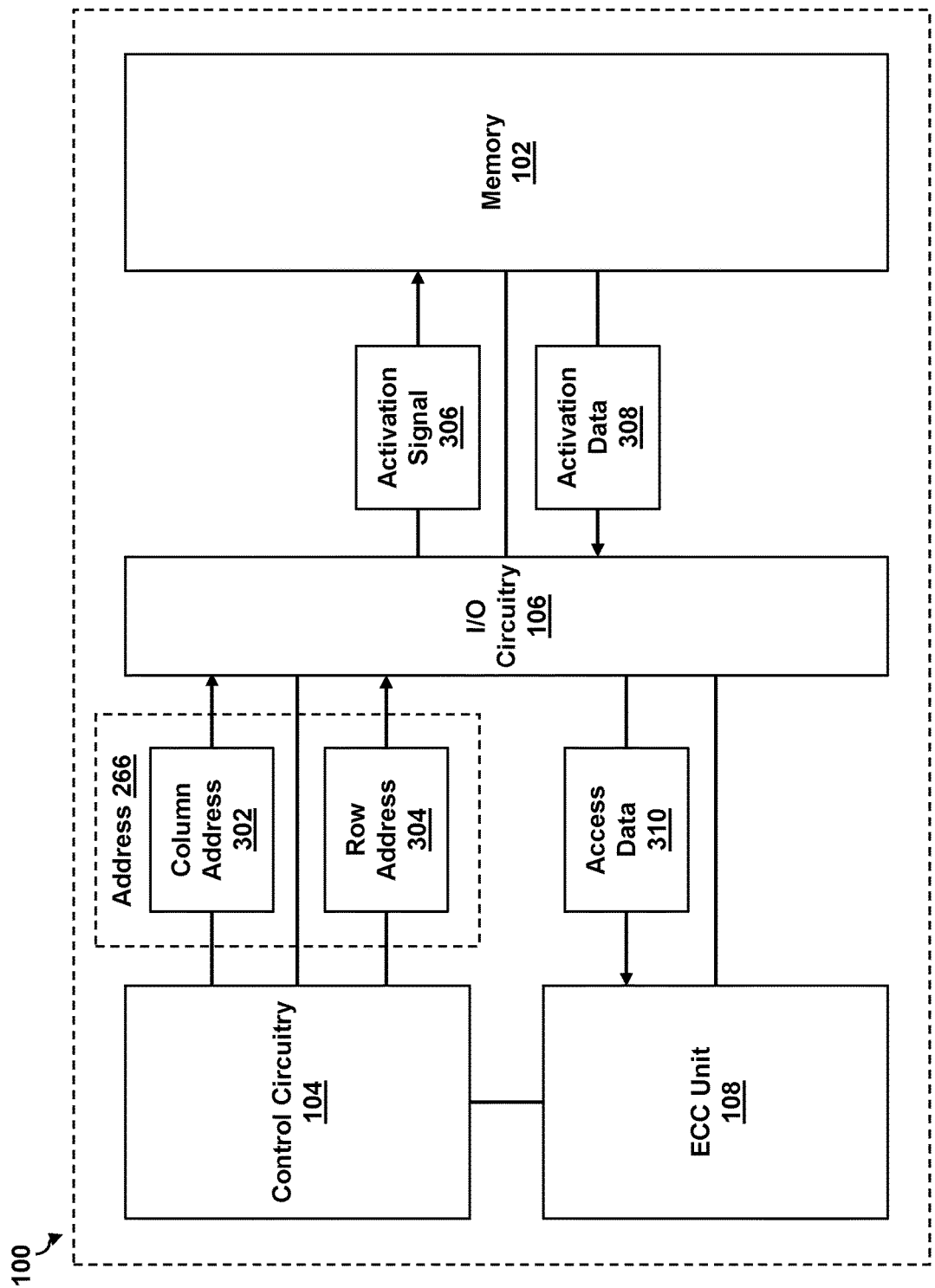
FIG. 3A is a component block and signaling diagram of a memory system suitable for implementing various embodiments.
Figure 3B:
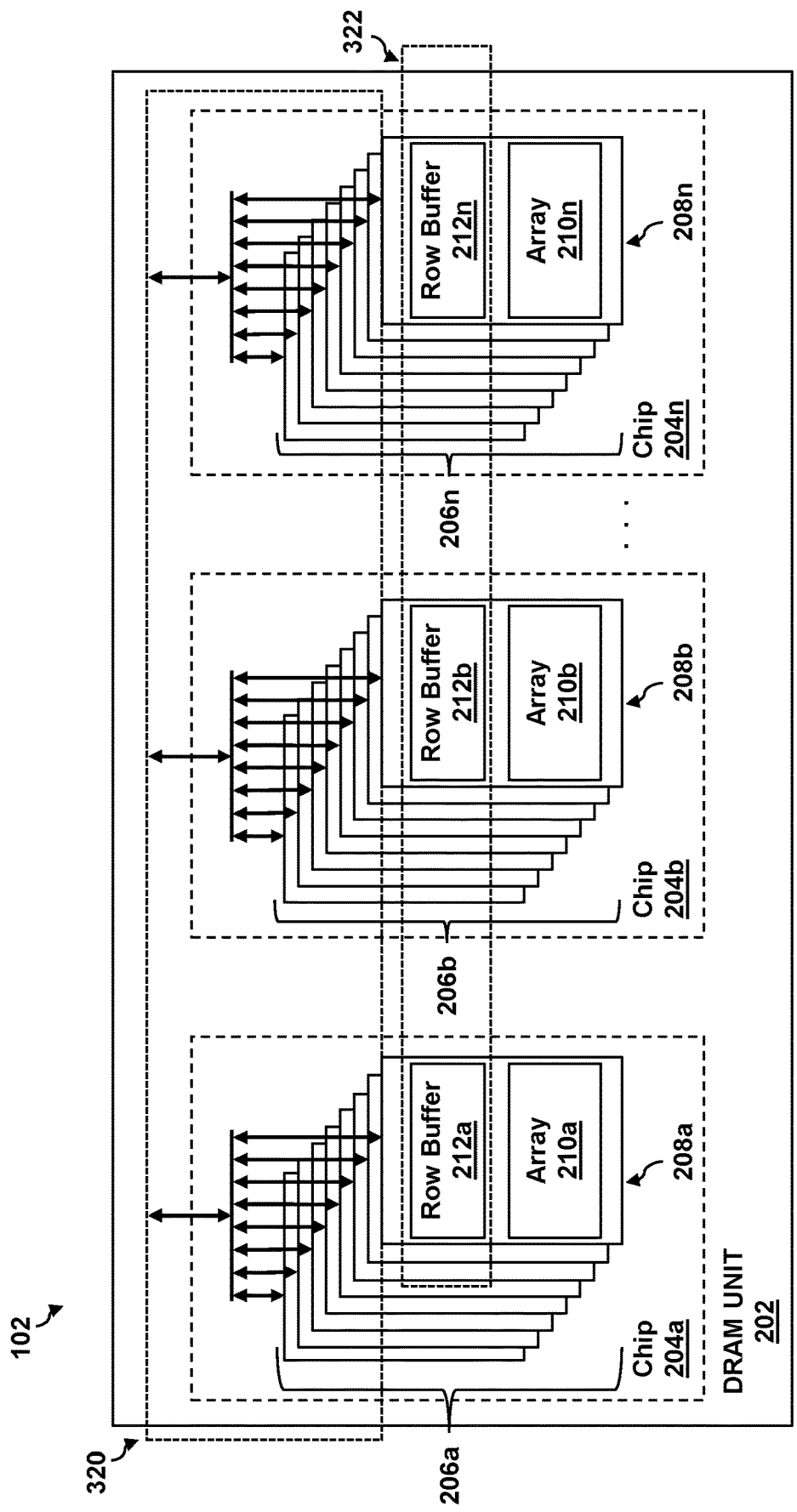
FIG. 3B is a component block diagram of a DRAM unit suitable for implementing various embodiments.

FIGS. 3A-3D illustrate an example of a memory access by the memory system 100. FIG. 3A is a diagram of the memory system 100 of FIG. 1 suitable for implementing various embodiments. FIG. 3B is a diagram of the memory 102 of FIG. 2A suitable for implementing various embodiments. With reference to FIGS. 1-3B, in the example illustrated in FIG. 3A the control circuitry 104 may receive a memory access request. The memory access request may be received from a processor or subsystem of a computing device, of which the memory system 100 is a component. The memory access request may include the address 266 for a memory access of the memory 102. The address 266 may include multiple bits that may be grouped into separate portions to represent a column address 302 and a row address 304 of the memory 102. For example, the column address 302 may be any number and combination of least significant bits of the address 266, and the row address 304 may be any number and combination of most significant bits of the address 266. The control circuitry 104 may send signals to the I/O circuitry 106 to control the memory access. For example, the control circuitry 104 may send a control signal (not shown) configured to indicate to the I/O circuitry 106 a type of memory access to implement, an address signal configured to indicate to the I/O circuitry 106 the address 266 at which to implement the memory access, a select signal (not shown) configured to activate a part of the memory 102 (e.g., a memory chip) for the memory access, and/or a data signal (not shown) for certain memory access types for which data may be written to the memory 102.

The I/O circuitry 106 may receive and interpret the signals from the control circuitry 104. The I/O circuitry 106 may determine the column address 302 and the row address 304 from the address 266. Using the row address 304, the I/O circuitry 106 may send an activation signal 306 to the memory 102. In some embodiments, the activation signal 306 may be a voltage and/or current applied to a word line of the memory 102 corresponding to the row address 304. In some embodiments, the activation signal 306 may be configured to indicate to the memory 102 the row address 304 of the word line at which to apply the voltage and/or current.

The memory 102 may receive the activation signal 306 and apply the voltage and/or current to the word line corresponding to the row address 304. An amount of data of the memory cells (e.g., memory cell 262) coupled to the powered word line and read out by the row buffer 212a-212n for the bank 206a-206n may be referred to herein as an activation unit 322 in the example illustrated in FIG. 3B. For example, the activation unit 322 may be the size of a page (e.g., 1 KB of data) of the memory 102. In some embodiments, the activation unit 322 may include activation data 308 of the memory cells coupled to the powered word line read out by the row buffer 212a-212n according to the address 266 of the memory access. The I/O circuitry 106 may retrieve activation data 308 from the memory 102 by powering the word line, allowing the activation data 308 to be read out by the I/O circuitry 106.

The I/O circuitry 106 may retrieve access data 310 from the activation data 308 using the received column address 302. The access data 310 may be any number of bits of the activation data 308. For example, the access data 310 may be a single bit or a word, which may have a word length of any number of bits, such as 8 bits, 16 bits, 32 bits, 64 bits, etc. The output size capability of the I/O circuitry 106 may be referred to herein as an access unit 320 in the example illustrated in FIG. 3B. The activation unit 322 may be larger than the access unit 320. For example, the activation unit 322 may be a page (e.g., 1 KB of data) of the memory, while the access unit 320 may be a subset of the activation unit 322, such as 16-64 bits. The access data 310 retrieved from the memory 102 may be the size of or smaller than the access unit 320. The access data 310 may be data located at the address 266 for the memory access. The row address 304 may indicate the word line having the activation data 308 from which to extract the access data 310. The column address 302 may indicate locations of the activation data 308 from which to extract the access data 310. The I/O circuitry 106 may use the received column address 302 to determine which portion of the data of the activation data 310 to extract as the access data 310. The I/O circuitry 106 may transmit the access data 310 to the ECC unit 108, which may detect and attempt to correct errors in the access data 310 as described further herein.

Figure 3C:
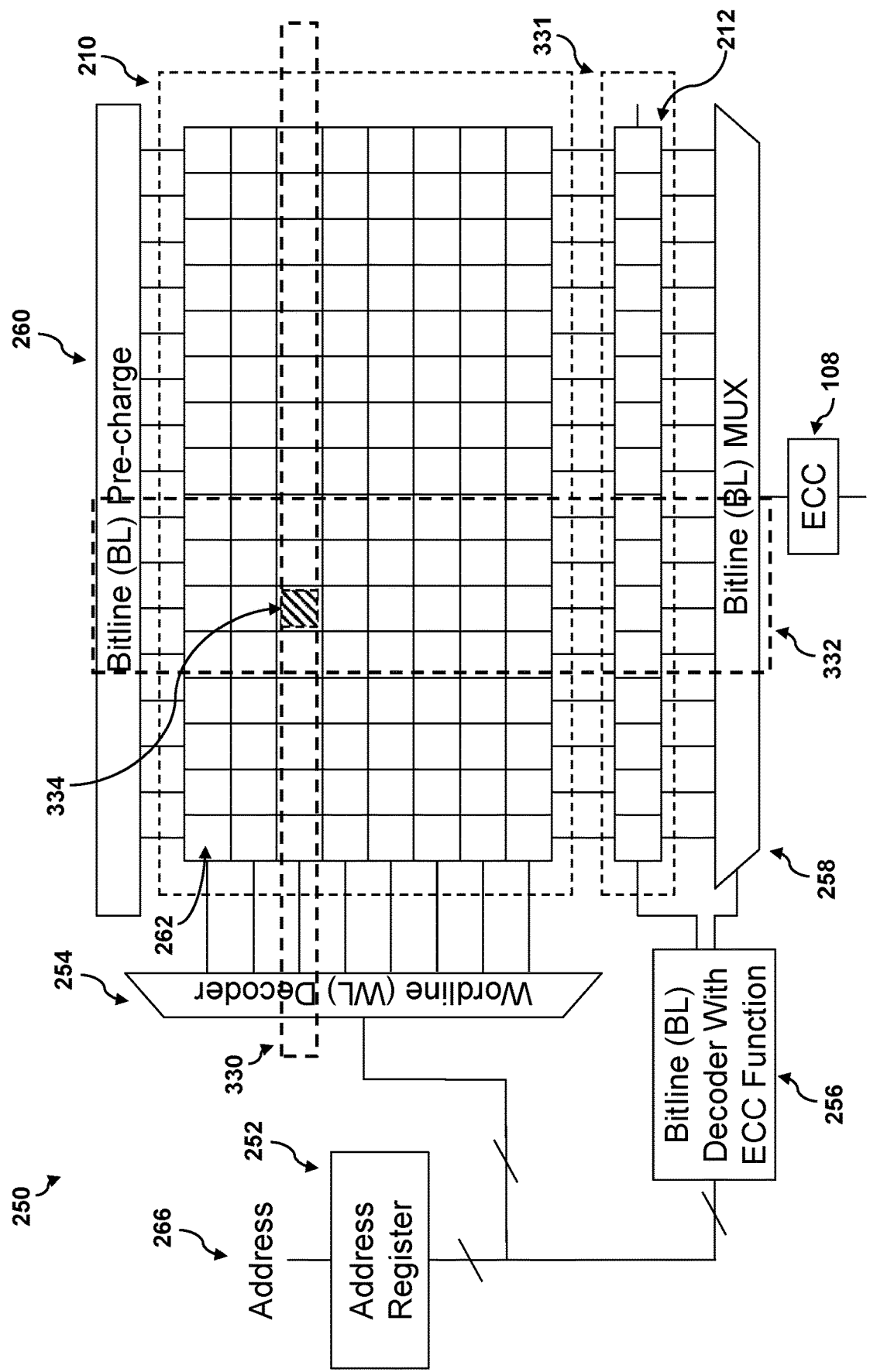
FIGS. 3C and 3D are component block diagrams of a memory chip suitable for implementing various embodiments.
Figure 3D:
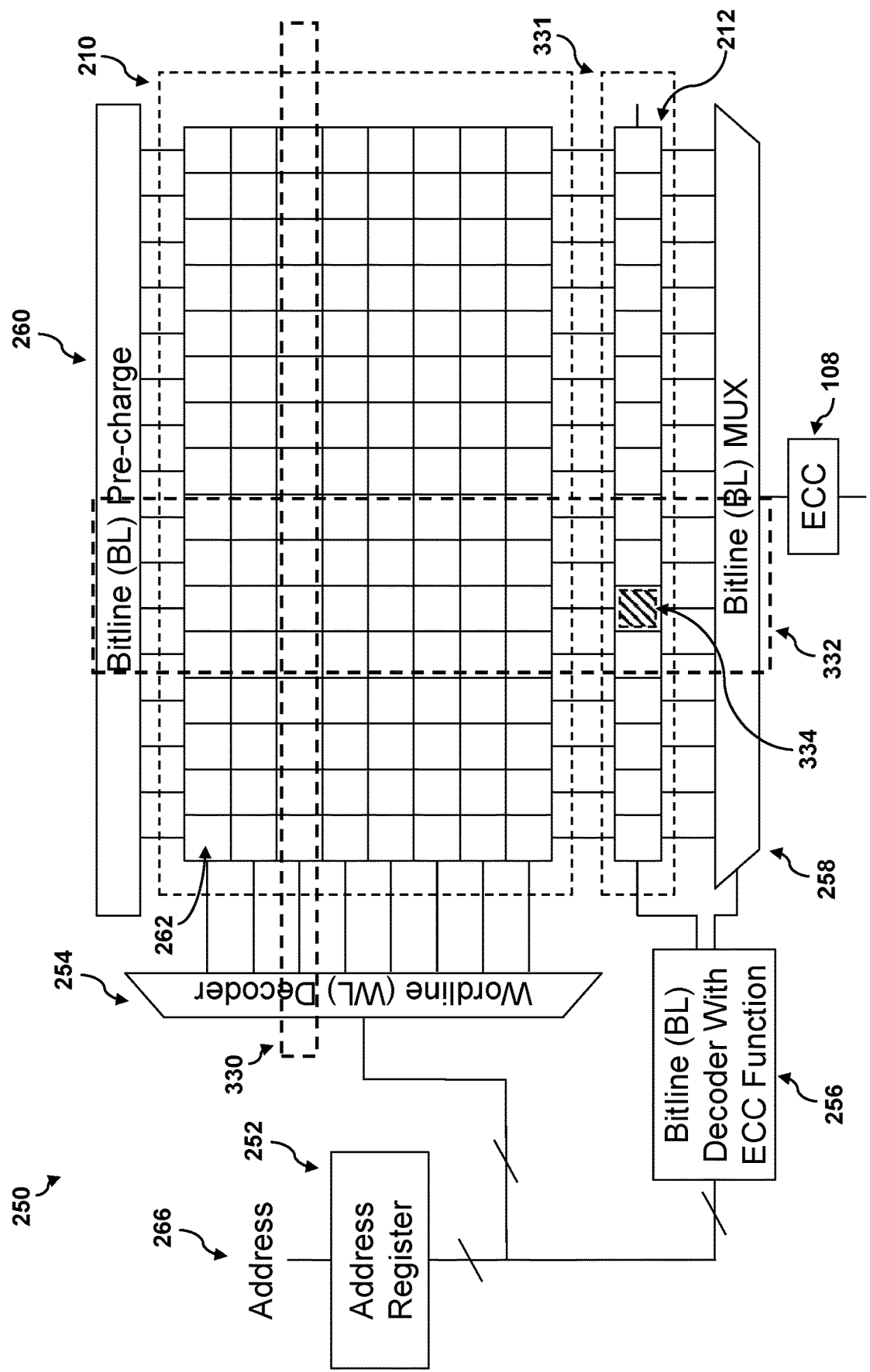

FIGS. 3C and 3D are diagrams that illustrate examples of the memory device 250 of FIG. 2B suitable for implementing various embodiments. With reference to FIGS. 1-3D, the wordline decoder 254 may activate a row 330 of the memory device 250 by powering the word line corresponding with row address 304 of the memory access. Activating the row 330 may activate the transistors for the memory cells 262 of the word line allowing the row 330 to be read out by the row buffer 212 of a size of an activation unit 331 (e.g., activation unit 322 in FIG. 3B).

The memory access may be for data the size of the access unit 332 (e.g., access unit 320 in FIG. 3B) distributed across several columns of the memory device 250. The intersection of the row 330 and the column(s) of the access unit 332 may be the target data of the memory access. A bit 334 of the target data may be stored at a particular column address 302 in FIG. 3C. The bit 334 of the target data may be read out by the row buffer 212 in FIG. 3D. Using the column address 302, the bitline decoder 256 may control the bitline multiplexer 258 to select the portion of the row buffer 212 corresponding to the column address 302 and output the bit 334 from the row buffer 212 to the ECC unit 108. The examples described herein may be described using a single bit 334 of the target data but are similarly applicable to any bit or combination of bits of the target data. The single bit 334 of the target data is used in the examples for ease of explanation and clarity and does not limit the scope of the claims or the description to a single bit 334 of the target data.

Figure 4A:
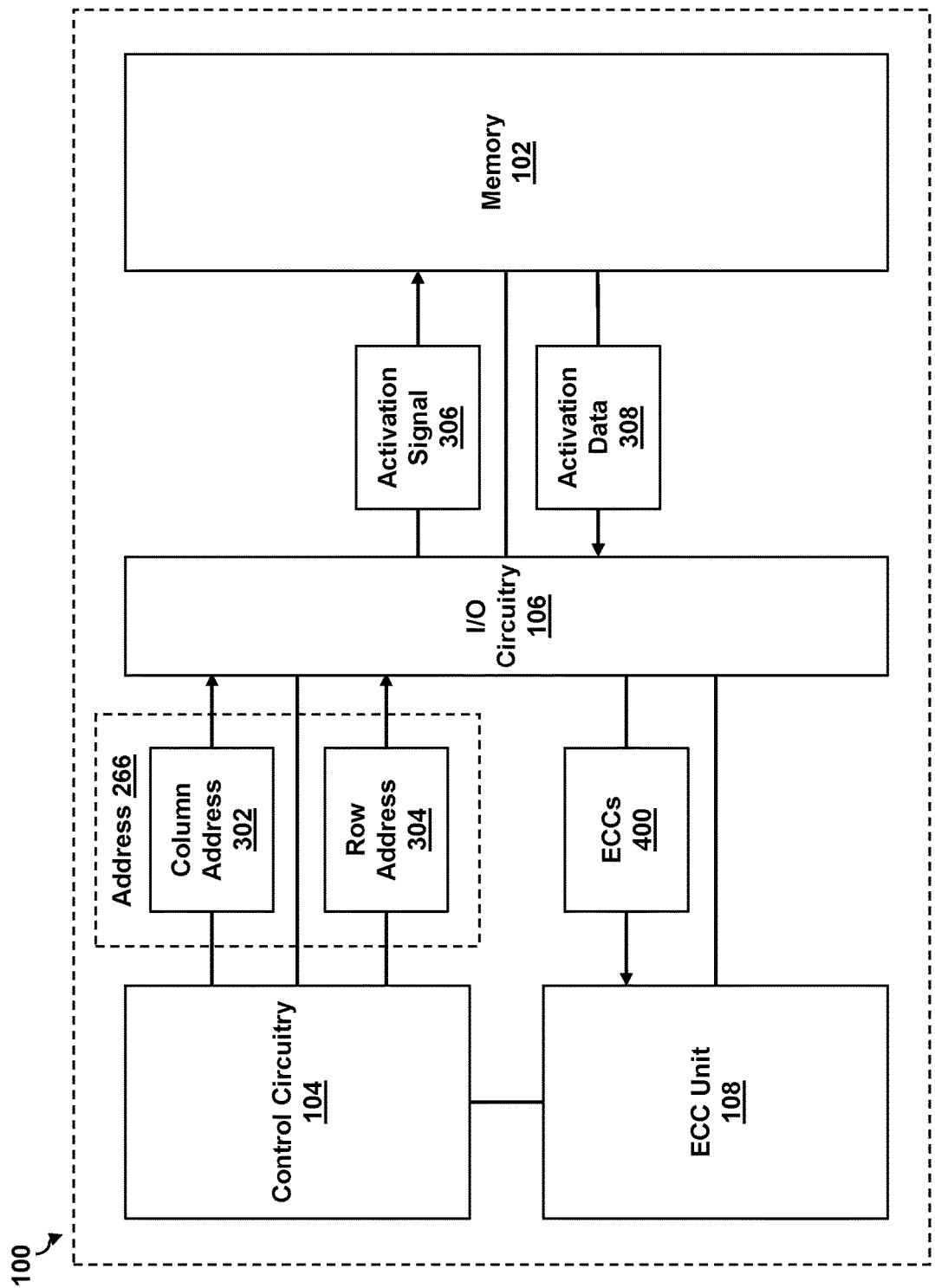
FIG. 4A is a component block and signaling diagram of a memory system suitable for implementing various embodiments.

FIGS. 4A-4G illustrate an example of error code correction by the memory system 100. FIG. 4A is a diagram of the memory system 100 of FIGS. 1 and 3A suitable for implementing various embodiments. Continuing with the example illustrated in FIG. 3A, with reference to FIGS. 1-4A, in the example illustrated in FIG. 4A the I/O circuitry 106 may retrieve ECCs 400 from the data for the activation unit 322 of the memory 102. The I/O circuitry 106 may retrieve the ECCs 400 using ECC column addresses determined by the I/O circuitry 106, as described further herein. The ECCs 400 may be any number and combination of bits from within the activation unit 322, including bits corresponding to the column address 302 of the memory access and/or bits corresponding to column addresses that do not correspond with the column address 302 of the memory access. The I/O circuitry 106 may use the determined column addresses to determine which portion of the data of the activation unit 322 to extract as the ECCs 400. The I/O circuitry 106 may transmit the ECCs 400 to the ECC unit 108, which may detect and attempt to correct errors in the access data 310 using the ECCs 400 as described further herein.

Figure 4B:
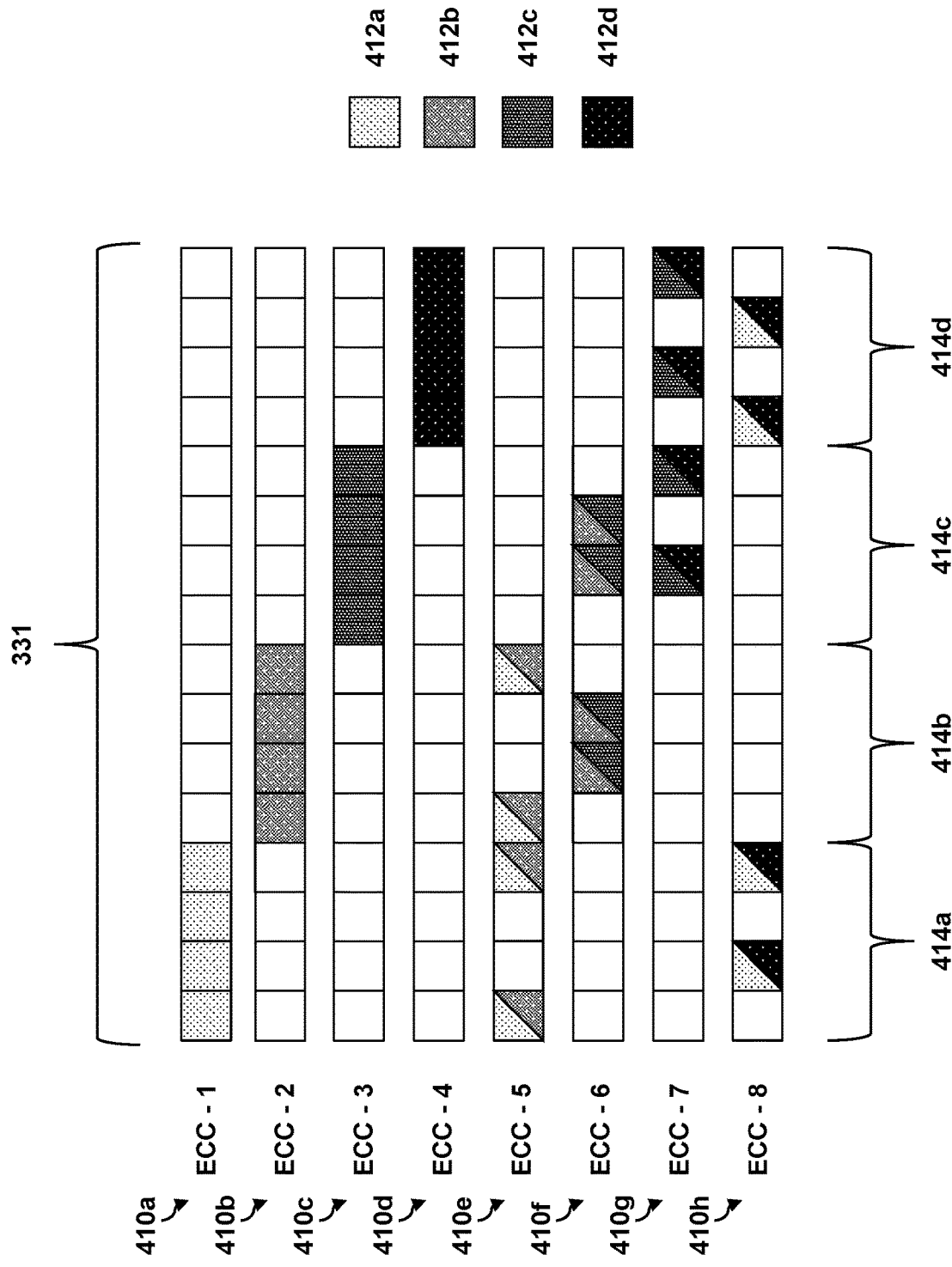
FIG. 4B is a block diagram of error correction code (ECC) groups suitable for implementing various embodiments.

FIG. 4B is a diagram illustrating an example of ECC groups 412a-412d suitable for implementing various embodiments. With reference to FIGS. 1-4B, the example illustrated in FIG. 4B shows ECC groups 412a-412d including multiple ECCs 410a-410h. Each ECC group 412a-412d is shaded with different patterns in FIG. 4B, and blocks shaded with multiple patterns belong to multiple ECC groups 412a-412d. The descriptions of the example illustrated in FIG. 4B are made using eight ECCs 410a-410h (e.g., ECC-1 410a, ECC-2 410b, ECC-3 410c, ECC-4 410d, ECC-5 410e, ECC-6 410f, ECC-7 410g, and ECC-8 410h) and four ECC groups 412a-412d but are similarly applicable to any number and combination ECCs and ECC groups. The eight ECCs 410a-410h and the four ECC groups 412a-412d are used in the example for ease of explanation and clarity and do not limit the scope of the claims or the description to eight ECCs and the four ECC groups.

Each bit stored in the memory 102 may be associated with any number and combination of ECCs 410a-410h. For example, any number and combination of ECCs 410a-410h may be associated with a bit, such as the bit 334, of the row 330 of the memory device 250. The bits of different rows of the memory device 250 may be associated with different ECCs than the ECCs 410a-410h associated with the bits of the row 330. The ECCs 410a-410h associated with a bit may be grouped into ECC groups 412a-412d. In other words, each hash group 412a-412d may be a selection of the ECCs 410a-410h. Each of the ECCs 410a-410h may include any number and combination of bits (e.g., the shaded blocks in FIG. 4B) of the activation unit 331 from which the associated bit 334 may be retrieved. For example, any number and combination of ECCs 410a-410h may concurrently reside in the row 330 of the memory device 250 and be read out to the row buffer 212. As such, any number and combination of ECCs 410a-410h may concurrently reside in the activation unit 331. The bits of the ECCs 410a-410h may be configured as bits or code for any type of error correction algorithm, process, or code, for example, Hamming codes, Hsiao codes, Reed-Solomon codes, Bose-Chaudhuri-Hocquenghem (BCH) codes, turbo codes, low-density-parity-check codes, etc. The composition of each ECC 410a-410h may be stored as an association of an ECC identifier (ID) and addresses of the ECC bits. In some embodiments, the composition of each ECC 410a-410h may be stored in association with an ECC group identifier (ID) for the ECC group 412a-412d to which each ECC 410a-410h belongs. For example, the composition of the ECCs 410a-410h may be stored in a data structure stored at the I/O circuitry 106. As another example, the ECCs 410a-410h included in an ECC group 412a-412d may include at least one bit within a same access unit 414a-414d as the associated bit 334. In other words, an ECC group 412a-412d criteria may be ECC bits included in a width of an access unit 414a-414d of the associated bit 334. For example, the ECC group 412a may include ECCs 410a, 410e, and 410h; the ECC group 412b may include ECCs 410b, 410e, and 410f; the ECC group 412c may include ECCs 410c, 410f, and 410g; and the ECC group 412d may include ECCs 410d, 410g, and 410h.

In some embodiments, the ECC groups 412a-412d may include existing ECCs (e.g., ECCs 410a-410d) and new ECCs (e.g., ECCs 410e-410h) enabled by the embodiments described herein. The existing ECCs 410a-410d may be limited to ECC bits that are within the access unit 414a-414d of a bit of the memory access. The new ECCs 410e-410h may include any number and combination of bits from the same activation unit 331 as the bit of the memory access.

In some embodiments, the bits of an access data and bits of an ECC 410a-410h may be one or more of the same bits and/or one or more different bits. Error correction may be implemented using an algorithm that calculates values from an ECC 410a-410h overlapping an access data to check for and correct errors in the bits of the access data. For example, error correction may translate between a data word (length=d, which may be input before encoding and output after decoding) used for computing operations, and an encoded word (length=d+e) stored in memory as a combination of the data word and an ECC 410a-410h. Error correction may use information in "d+e" bits to make sure the "d" data bits are correct. An example of error correction for which the bits of an access data and bits of an ECC 410a-410h may include one or more of the same bits and/or one or more different bits may be BCH codes. Examples of ECCs (e.g., EEC 410b, 410e) for which the bits of an access data (e.g., bit 334 in FIGS. 3C and 3D) and bits of the ECC (e.g., ECC 430 in FIGS. 4D and 4E, ECC 442 in FIGS. 4F and 4G) may be one or more of the same bits and/or one or more different bits are described herein with reference to FIGS. 4D-4G.

In some embodiments, the bits of an access data and bits of an ECC 410a-410h may be one or more different bits. Error correction may be implemented using an algorithm that compares values from an ECC 410a-410h with aspects of the bits of an access data to check for and correct errors in the bits of the access data. For example, error correction may translate between a data word (length=d) used for computing operations, and an encoded word (length=d+e) stored in memory as a combination of the data word and an ECC 410a-410h. Error correction may use information in "e" bits to make sure the "d" data bits are correct. An example of error correction for which the bits of an access data and bits of an ECC 410a-410h may be one or more different bits may be Hamming codes. An examples of an ECC (e.g., EEC 410e) for which the bits of an access data (e.g., bit 334 in FIGS. 3C and 3D) and bits of the ECC (e.g., ECC 442 in FIGS. 4F and 4G) may be one or more different bits is described herein with reference to FIGS. 4F and 4G.

Figure 4C:
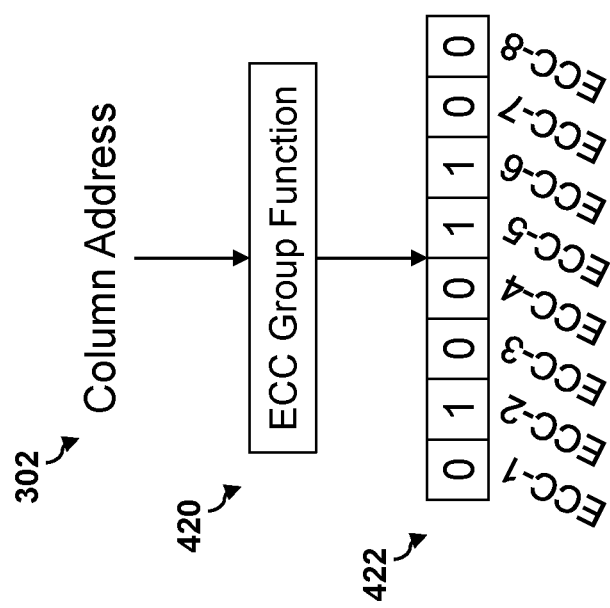
FIG. 4C is a block diagram of an ECC function for generating ECC group maps suitable for implementing various embodiments.

FIG. 4C is a diagram illustrating an example of an ECC groups function 420 suitable for implementing various embodiments. With reference to FIGS. 1-4C, the example illustrated in FIG. 4C may determine whether an ECC 410a-410h belongs to an ECC group 412a-412d for a bit of a memory access using an ECC group function 420. The ECC group function 420 may be any number and combination of functions configured to produce a result that may be interpreted, for example, by the I/O circuitry 106 and/or bitline decoder 256, to determine an EEC group 412a-412d having ECCs 410a-410h for a bit of the memory access. For example, the ECC group function 420 may include a function for each ECC 410a-410h that may produce a result indicating to the I/O circuitry whether an associated ECC 410a-410h is part of an ECC group 412a-412d for the bit of the memory access. In some embodiments, the ECC group function 420 may be any number and combination of hash functions. In some embodiments, the ECC group function 420 result may be an ECC group array 422 for which each position in the array is associated with an ECC 410a-410h, and a value at each position in the array may indicate whether the associated ECC 410a-410h is part of an ECC group 412a-412d for the bit of the memory access. For example, a logical true value "1" may indicate that an ECC 410a-410h is part of an ECC group 412a-412d for the bit of the memory access, and a logical false value "0" may indicate that an ECC 410a-410h is not part of an ECC group 412a-412d for the bit of the memory access. In some embodiments, the ECC group function 420 may generate the ECC group array 422 based on an input of a column address 302 for the bit of the memory access.

For another example, the ECC group function 420 may include a function for each ECC group 412a-412d that may produce a result indicating to the I/O circuitry whether an associated ECC group 412a-412d is associated with the bit of the memory access. In some embodiments, the ECC group function 420 may be any number and combination of hash functions. In some embodiments, the ECC group function 420 result may be an ECC group array (not shown) for which each position in the array is associated with an ECC group 412a-412d, and a value at each position in the array may indicate whether the associated ECC group 412a-412d is associated with the bit of the memory access. For example, a logical true value "1" may indicate that an ECC group 412a-412d is associated with the bit of the memory access, and a logical false value "0" may indicate that an ECC group 412a-412d is not associated with the bit of the memory access. In some embodiments, the ECC group function 420 may generate the ECC group array based on an input of a column address 302 for the bit of the memory access.

For the purposes of the examples illustrated in FIGS. 4B and 4C, the access unit 414b may correspond with the access unit 332 of the memory access in FIGS. 3C and 3D. The ECC group 412b may correspond to the bit 334 of the memory access in FIGS. 3C and 3D. The ECC group function 420 may use the column address 302 of the bit 334 to generate the ECC group array 422. The resulting ECC group array 422 may indicate that the ECCs 410b (ECC-2), 410e (ECC-5), and 410f (ECC-6) of ECC group 412b may correspond to the bit 334. The I/O circuitry 106 may retrieve the column addresses of the bits of the ECCs 410b, 410e, 410f, and use these column address to retrieve the ECCs 410b, 410e, 410f from the activation unit 331 in the memory 102. The ECCs 400 in FIG. 4A may include the ECCs 410b, 410e, 410f of ECC group 412b for the bit 334 of the memory access.

FIGS. 4D-4G are diagrams that illustrate examples of the memory device 250 of FIGS. 2B, 3C, and 3D suitable for implementing various embodiments. With reference to FIGS. 1-4G, the bitline decoder 256 may use the column address 302 received from the address register 252 as an input to an ECC group function 420 to determine the ECCs (e.g., ECCs 410a-410h in FIG. 4B) for the bit 334 of the memory access.

Figure 4D:
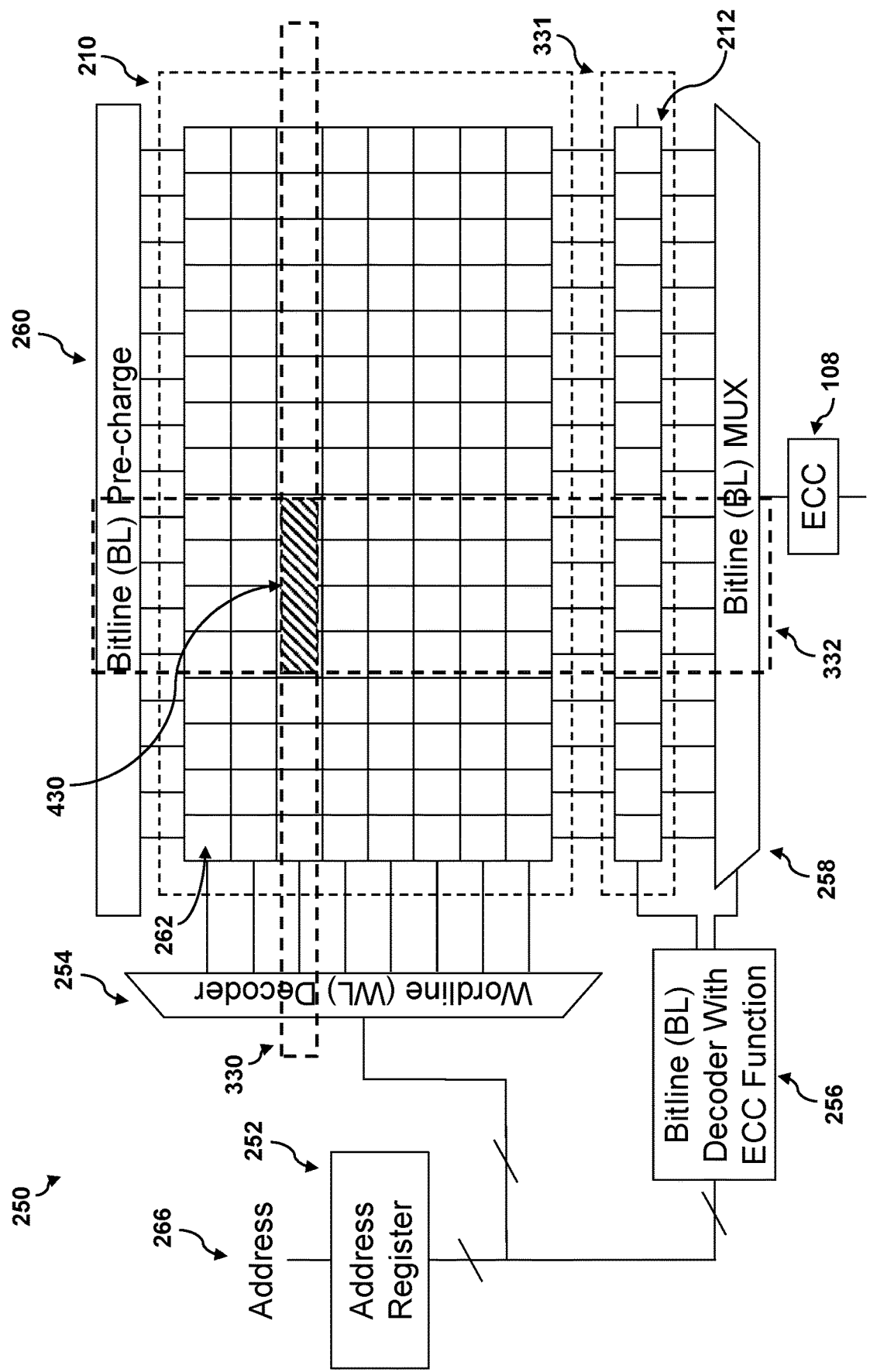
FIGS. 4D-4G are component block diagrams of a memory chip suitable for implementing various embodiments.

In FIG. 4D, the bitline decoder 256 may determine that an ECC 430 (e.g., ECC 410b in FIG. 4B) is associated with the bit 334 of the memory access. The bitline decoder 256 may implement the ECC group function 420 using the column address 302 to determine that the ECC 430 is associated with of the bit 334 of the memory access from the resulting ECC group array 422.

The ECC 430 may include the data stored in the memory cells 262 of the row 330 read out to the row buffer 212 as the activation unit 331 and from the access unit 332. Each bit of the ECC 430 may be stored at a particular column address. The bitline decoder 256 may determine the column addresses for the bits of the ECC 430. The bits of the ECC 430 may be read out by the row buffer 212 in FIG. 4E. Using the column addresses for the ECC 430, the bitline decoder 256 may control the bitline multiplexer 258 to select the portions of the row buffer 212 corresponding to the column addresses for the ECC 430 and output the bits of the ECC 430 from the row buffer 212 to the ECC unit 108. In this example, the bits of the ECC 430 and the bit 334 may be one or more of the same bits and/or one or more different bits. One of ordinary skill in the art will realize that any number and combination of the bits of the row 330 read out to the row buffer 212 as the activation unit 331 and from the access unit 332.

Figure 4E:
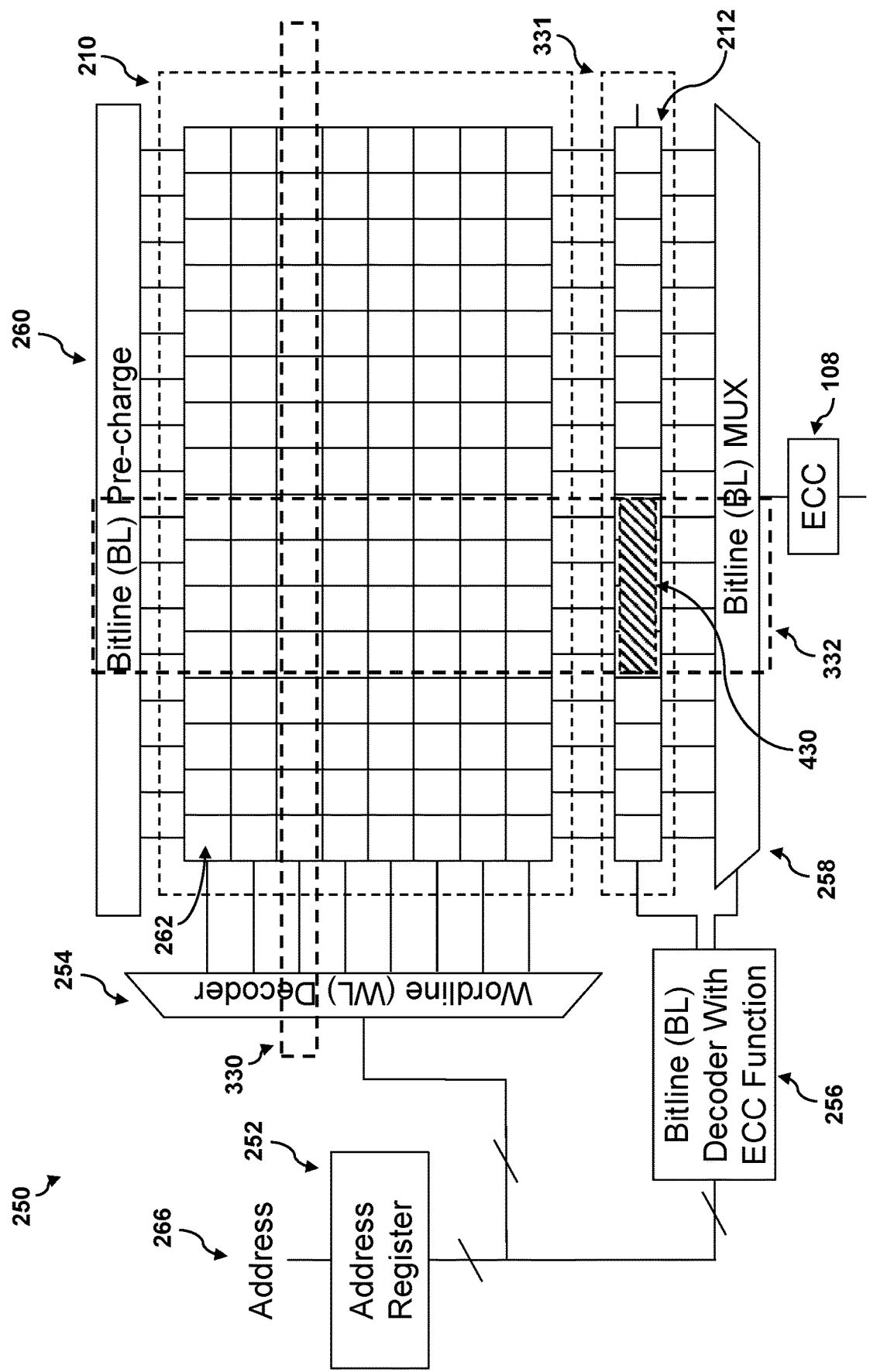
Figure 4F:
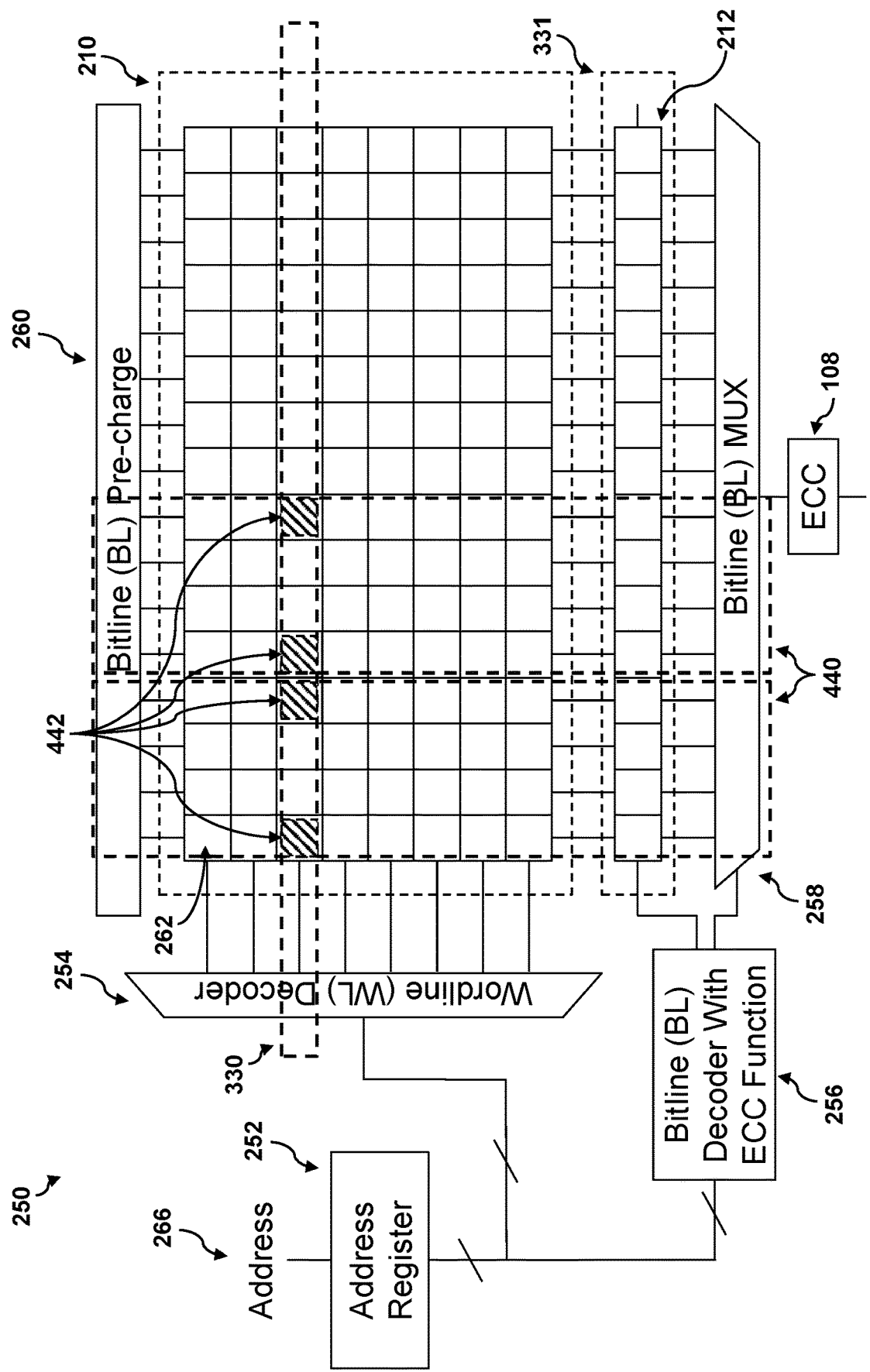
Figure 4G:
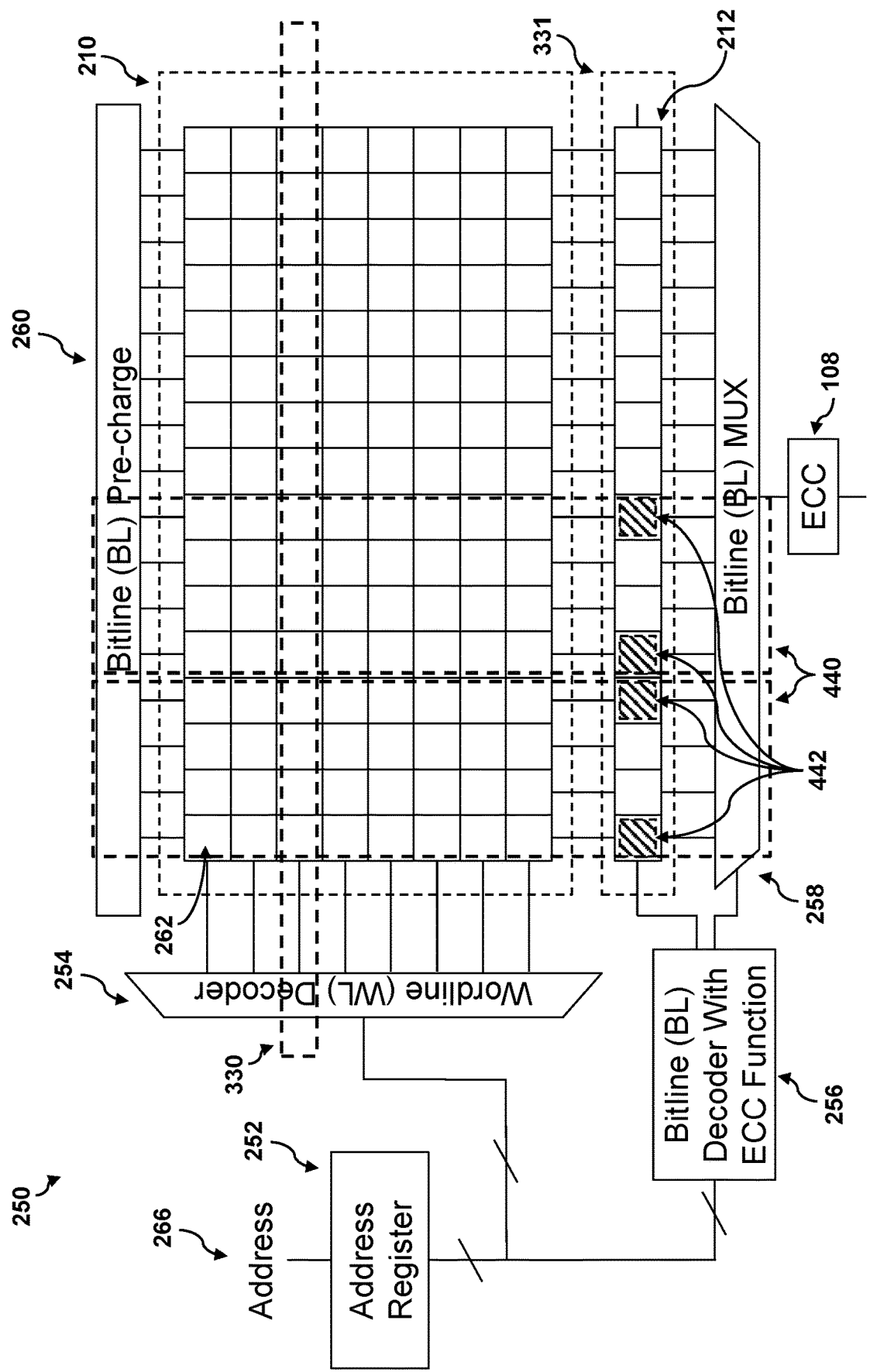

In FIG. 4F, the bitline decoder 256 may determine that an ECC 442 (e.g., ECC 410e in FIG. 4B) may be associated with the bit 334 of the memory access. The bitline decoder 256 may implement the ECC group function 420 using the column address 302 to determine that the ECC 442 is associated with of the bit 334 of the memory access from the resulting ECC group array 422.

The ECC 442 may include the data stored in the memory cells 262 of the row 330 read out to the row buffer 212 as the activation unit 331 and from multiple access units 440, which may include the access unit 332 of the bit 334 of the memory access. Each bit of the ECC 442 may be stored at a particular column address. The bitline decoder 256 may determine the column addresses for the bits of the ECC 442. The bits of the ECC 442 may be read out by the row buffer 212 in FIG. 4G. Using the column addresses for the ECC 442, the bitline decoder 256 may control the bitline multiplexer 258 to select the portions of the row buffer 212 corresponding to the column addresses for the ECC 442 and output the bits of the ECC 442 from the row buffer 212 to the ECC unit 108. In this example, the bits of the ECC 430 and the bit 334 may be one or more different bits. One of ordinary skill in the art will realize that any number and combination of the bits of the row 330 read out to the row buffer 212 as the activation unit 331 and from multiple access units 440.

In some embodiments, the examples illustrated in FIGS. 4E and 4F may be similarly implemented for any further ECCs (e.g., ECC 410a, 410c, 410d, 410f, 410g, 410h) that may be part of a relevant ECC group (e.g., ECC group 412a-412d). Continuing with this example, the examples illustrated in FIGS. 4E and 4F may be similarly implemented for ECC 410f of the ECC group 412b.

Figure 5A:
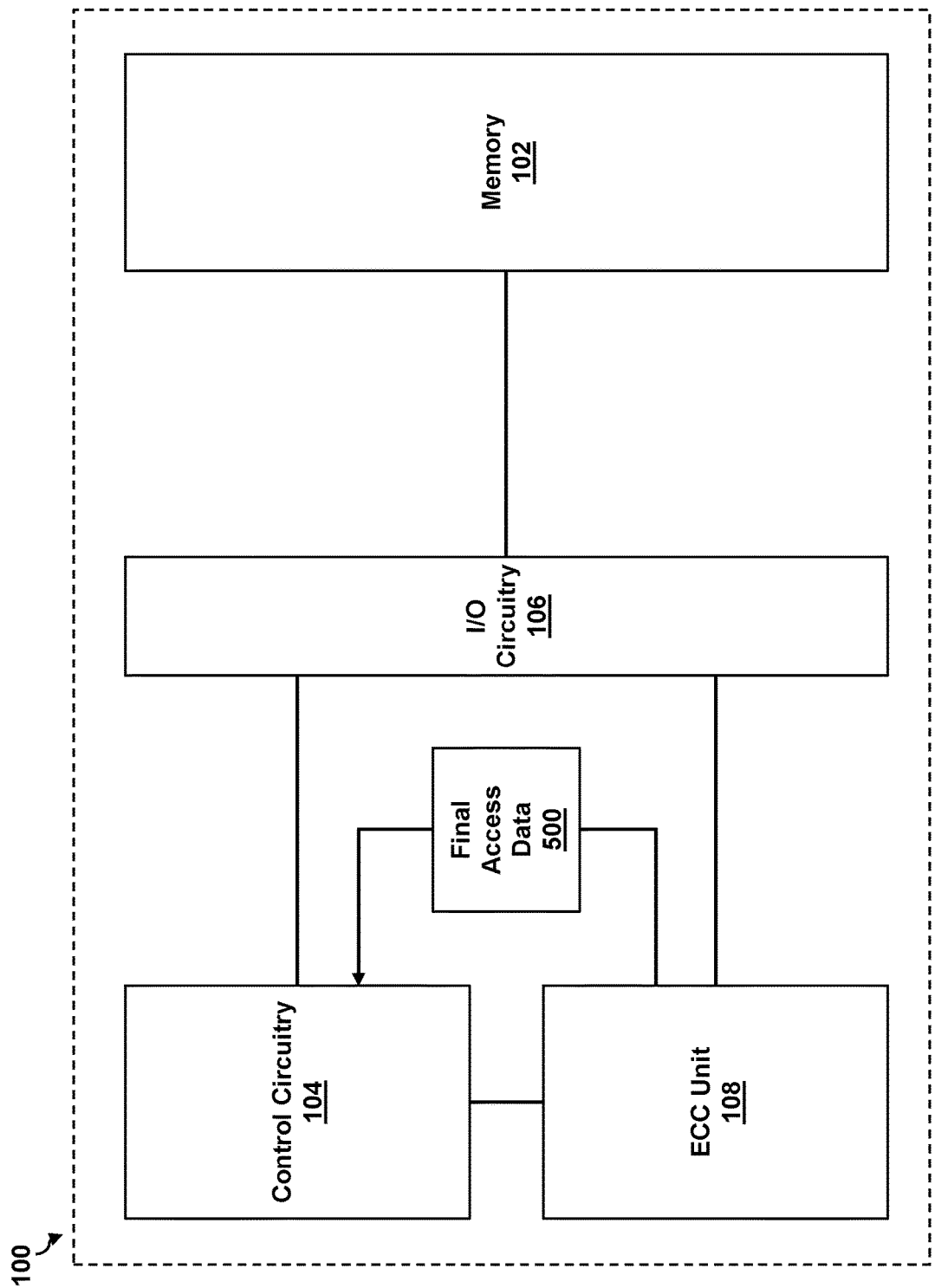
FIG. 5A is a component block and signaling diagram of a memory system suitable for implementing various embodiments.
Figure 5B:
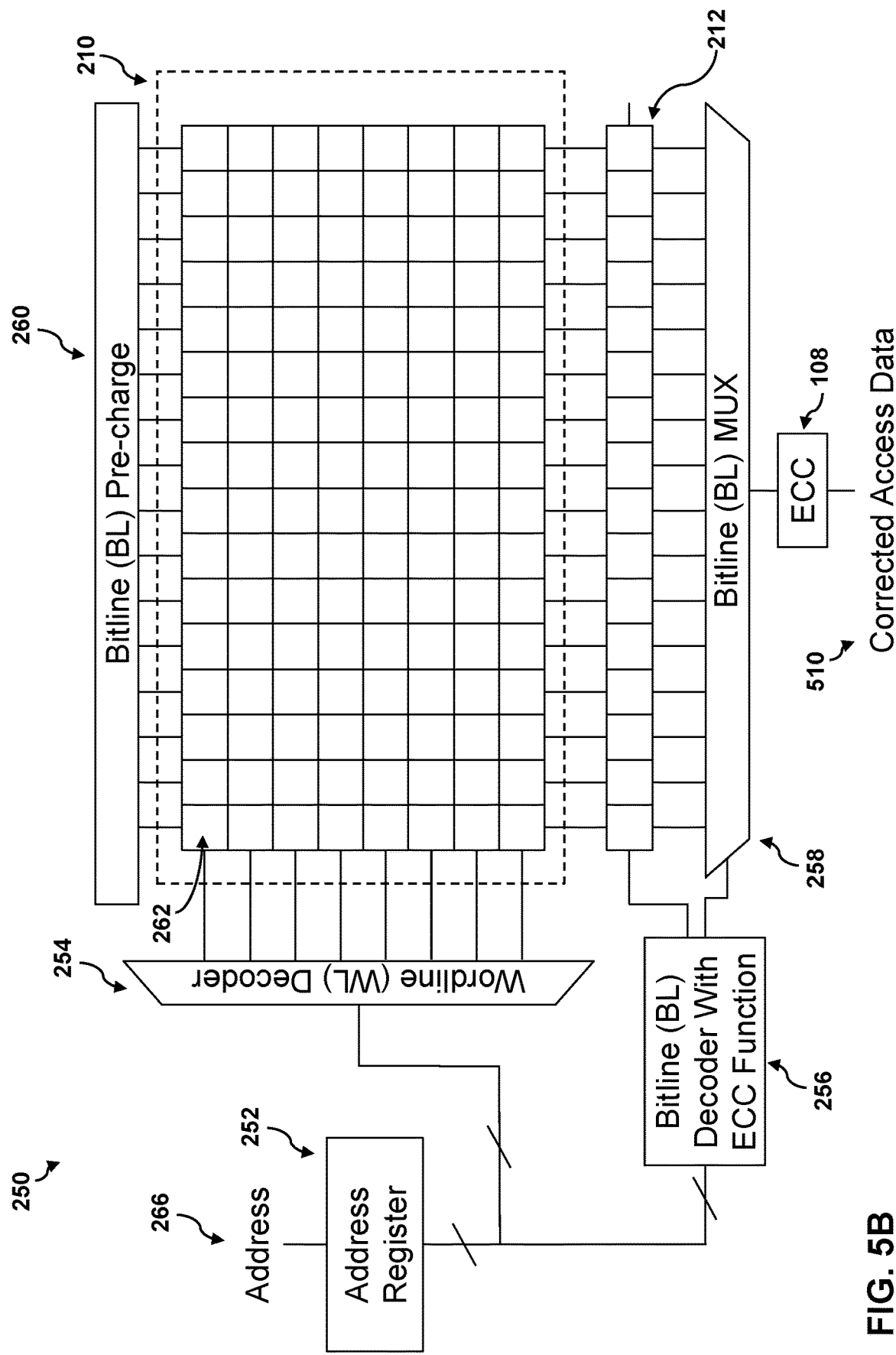
FIG. 5B is a component block diagram of a memory chip suitable for implementing various embodiments.

FIGS. 5A and 5B illustrate an example of error code correction by the memory system 100. FIG. 5A is a diagram of the memory system 100 of FIGS. 1, 3A, and 4A suitable for implementing various embodiments. Continuing with the example illustrated in FIG. 4A, with reference to FIGS. 1-5A, in the example illustrated in FIG. 5A the ECC unit 108 may use the received ECCs 400 to determine whether the received access data 310 has an error and to attempt to correct the error. The ECC unit 108 may implement any type of error correction algorithm, process, or code, for example, Hamming codes, Hsiao codes, Reed-Solomon codes, Bose-Chaudhuri-Hocquenghem codes, turbo codes, low-density-parity-check codes, etc. The process of error correction may be implemented in multiple iterations. For each iteration, the ECC unit 108 may use a different one of the ECCs 400 to attempt to correct an error detected in the access data 310.

The ECC unit 108 may output a final access data 500 to the control circuitry 104. In some embodiments, the ECC unit 108 may not detect any errors in the access data 310 and may output the access data 310 as the final access data 500. In some embodiments, the ECC unit 108 may detect and correct an error in the access data 310 and output corrected access data as the final access data 500. The control circuitry 104 may transmit the final access data 500 to the component of the computing device that issued the memory access request received by the control circuitry 104.

FIG. 5B is a diagram that illustrates an example of the memory device 250 of FIGS. 2B, 3C, 3D, and 4D-4G suitable for implementing various embodiments. With reference to FIGS. 1-5B, the ECC unit 108 may generate and output a corrected access data 510 (e.g., final access data 500). The ECC unit 108 may detect an error in the bit 334 of the memory access, received from the bitline multiplexer 258 in FIG. 3D. The ECC unit 108 may correct the error in the bit 334 of the memory access using one of the ECCs 430, 442, received from the bitline multiplexer 258 in FIGS. 4E and 4G. In some embodiments, the ECC unit 108 may not be able to correct the error in the bit 334 of the memory access using a first ECC 430 and may attempt to fix the error using a second ECC 442. In some embodiments, the ECC unit 108 may iterate through using ECCs (e.g., ECC 410*a*-410*h* in FIG. 4B) of a relevant ECC group (e.g., ECC group 412*a*-412*d* in FIG. 4B) until the error in the bit 334 of the memory access is fixed or no ECCs remain. The corrected access data 510 may be generated and output by the ECC unit 108 when the ECC unit 108 successfully corrects the error in the bit 334 of the memory access.

FIG. 6 is a process flow illustrating steps of a method 600 for accessing memory in a memory system and performing error correction, in accordance with various embodiments. With reference to FIGS. 1-6, the method 600 may be implemented in software executing in a processor (e.g., I/O circuitry 106, in FIGS. 1, 3A, 4A, 5A, ECC unit 108 in FIGS. 1, 2B, 3A, 3C-4A, 4D-5B, bitline decoder 256 in FIGS. 2B, 3C, 3D, 4D-4G, 5B), in hardware (e.g., memory 102 in FIGS. 1, 2A, 3A, 3B, 4A, 5A, I/O circuitry 106 in FIGS. 1, 3A, 4A, 5A, ECC unit 108 in FIGS. 1, 2B, 3A, 3C-4A, 4D-5B, row buffer 212 in FIGS. 2A, 2B, 3B-3D, 4D-5B, memory device 250, wordline decoder 254, bitline decoder 256, bitline multiplexer 258 in FIGS. 2B, 3C, 3D, 4D-4G, 5B), or in a combination of a software-configured processor and dedicated hardware, such as a processor executing software within a memory system (e.g., memory system 100 in FIGS. 1, 3A, 4A, 5A) that includes other individual components, and various memory/cache controllers (e.g., control circuitry 104 in FIGS. 1, 4A, 5A). In order to encompass the alternative configurations enabled in various embodiments, the hardware implementing the method 600 is referred to herein as a "memory control device."

The method 600 is described herein with reference to certain structural elements for purposes of illustration and ease of reference. However, other suitable structural elements are contemplated within the scope of the disclosure for performing the operations of the method 600. One skilled in the art will realize that the illustrated operation of the method 600 is one example, and it should be understood that any of a variety of operations of the method 600 may be omitted, re-sequenced, and/or added while remaining within the scope of the disclosure.

In block 602, the memory control device may decode a row address (e.g., row address 304 in FIGS. 3A, 4A) of a memory (e.g., memory 102 in FIGS. 1, 2A, 3A, 3B, 4A, 5A, memory device 250 in FIGS. 2B, 3C, 3D, 4D-4G, 5B) and activate a corresponding row (e.g., row 330 in FIGS. 3C, 3D, 4D-4G) of an array of memory cells (e.g., memory cells 262 in FIGS. 2B, 3C, 3D, 4D-4G, 5B) corresponding to a size of an activation unit (e.g., activation unit 322 in FIG. 3B, activation unit 331 in FIGS. 3C, 3D, 4B, 4D-4G). The memory control device may decode the row address from a memory access address (e.g., address 266 in FIGS. 2B, 3A, 3C, 3D, 4A, 4D-4G, 5B) received as part of a memory access request by a memory system (e.g., memory system 100 in FIGS. 1, 3A, 4A, 5A) to which the memory belongs. The memory access request may originate from a component, such as a processor or subsystem, of a computing device to which the memory system belongs. For example, the memory control device may interpret at least a portion of the memory access address as the row address and correlate the row address with a word line coupled to the array of memory cells. The memory control device may provide voltage and/or current to the word line to activate the array of memory cells. In some embodiments, the memory control device decoding the row address of the memory and activate the corresponding row of in the array of memory cells in block 602 may include an I/O circuitry (e.g., I/O circuitry 106, in FIGS. 1, 3A, 4A, 5A) and/or a wordline decoder (e.g., wordline decoder 254 in FIGS. 2B, 3C, 3D, 4D-4G, 5B).

In block 604, the memory control device may read and amplify data in the activated row (e.g., activation data 308 in FIGS. 3A, 4A). Activation of the row may trigger transistors of the memory cells in the row to allow the data stored at the memory cells to be available on a respective bit line for each memory cell. The memory control device may read the data from the memory cells via the bit lines and amplify the read data. In some embodiments, the memory control device reading and amplifying the data in the activated row in block 604 may include the I/O circuitry and/or a row buffer (e.g., row buffer 212 in FIGS. 2A, 2B, 3B-3D, 4D-5B).

In block 606, the memory control device may decode a column address (e.g., column address 302 in FIGS. 3A, 4A, 4C) and select a subset of the activated row corresponding to the column address as access data (e.g., access data 310 in FIG. 3A, memory bit 334 in FIGS. 3C, 3D). The memory control device may decode the column address from the memory access address received as part of the memory access request by the memory system to which the memory belongs. For example, the memory control device may interpret at least a portion of the memory access address as the column address and correlate the column address with a bit line coupled to a memory cell of the array of memory cells in the activated row. The memory control device may control a bitline multiplexer (e.g., bitline multiplexer 258 in FIGS. 2B, 3C, 3D, 4D-4G, 5B) to select the subset from the data read out and amplified in block 604. For example, the bitline multiplexer may select the subset from a portion of the row buffer coupled to the bit line that correlates to the column address. In some embodiments, the memory control device decoding the column address and selecting the subset of the activated row corresponding to the column address as the access data in block 606 may include the I/O circuitry, a bitline decoder (e.g., bitline decoder 256 in FIGS. 2B, 3C, 3D, 4D-4G, 5B), and/or the bitline multiplexer.

In block 608, the memory control device may determine ECCs (e.g., ECC 400 in FIG. 4A, ECC 410a-410h in FIG. 4B, ECC 430 in FIGS. 4D, 4E, ECC 442 in FIGS. 4F, 4G) corresponding to the column address. The memory control device may use an ECC group function (e.g., ECC group function 420 in FIG. 4C) to determine which ECCs based on using the column address as an input. The ECC group function may generate an output (e.g., ECC group array 422 in FIG. 4C) that indicates to the memory control device which of the ECCs correspond to the column address. For example, the output may be a data structure for which each position in the data structure is associated with an ECC, and a value at each position in the data structure may indicate whether the associated ECC is part of an ECC group (e.g., ECC group 412a-412d in FIG. 4B) for the column address. For another example, the output may be a data structure for which each position in the data structure is associated with an ECC group, and a value at each position in the data structure may indicate whether the associated ECC group is associated with the column address. The memory control device may use the identified ECC group to determine that ECCs associated with the ECC group are associated with the column address. In some embodiments, the memory control device determining the ECCs corresponding to the column address in block 608 may include the I/O circuitry, the bitline decoder, and/or the ECC group function.

In block 610, the memory control device may retrieve ECCs corresponding to the column address of the memory access. Each bit of an ECC may be associated with a column address. The column addresses for the bits of the ECCs may be determined, for example, from a data structure associating the ECCs with the column addresses for the bits of the ECCs. The memory control device may retrieve the column addresses for the bits of any number and combination of the ECCs and use the column addresses to extract the data corresponding to the column addresses. For example, the memory control device may correlate the column addresses with bit lines coupled to memory cells of the array of memory cells in the activated row. The memory control device may control the bitline multiplexer to select subsets from the data read out and amplified in block 604 as ECCs. For example, the bitline multiplexer may select the subsets from portions of the row buffer coupled to the bit lines that correlate to the column addresses. In some embodiments, the memory control device may retrieve as few as one of the ECCs corresponding to the column address of the memory access per iteration and may implement successive iterations following iterations of block 612 and/or optional block 614 as described further herein. In some embodiments, the memory control device retrieving the ECCs corresponding to the column address of the memory access in block 610 may include the I/O circuitry, the bitline decoder, and/or the bitline multiplexer.

In block 612, the memory control device may check the access data for errors using the ECCs. The memory control device may use any known error detection means to determine whether the access data includes errors. The memory control device may use any number and combination of the ECCs associated with the column address of the memory access to implement the known error detection means. In some embodiments, the memory control device may iteratively implement the known error detection means using different ones of the ECCs, as described further herein for the method 700 with reference to FIGS. 7A and 7B. For example, the memory control device may iteratively implement the known error detection means using different ones of the ECCs until an error in the access data is identified and/or until the known error detection means is implemented with each of the ECCs. In some embodiments, the memory control device checking the access data for errors using the ECCs in block 612 may include an ECC unit (e.g., ECC unit 108 in FIGS. 1, 2B, 3A, 3C-4A, 4D-5B).

In optional block 614, the memory control device may correct an error in the access data. Block 614 may be implemented in response to identifying an error in the access data in block 612. The memory control device may use any known error correction means to correct the error in the access data. For example, the memory control device may use Hamming codes, Hsiao codes, Reed-Solomon codes, Bose-Chaudhuri-Hocquenghem codes, turbo codes, low-density-parity-check codes, etc. The memory control device may use any number and combination of the ECCs associated with the column address of the memory access to implement the known error correction means. In some embodiments, the memory control device may iteratively implement the known error correction means using different ones of the ECCs, as described further herein for the method 700 with reference to FIGS. 7A and 7B. For example, the memory control device may iteratively implement the known error correction means using different ones of the ECCs until an error in the access data is corrected and/or until the known error correction means is implemented with each of the ECCs. In some embodiments, the memory control device correcting the error in the access data in optional block 614 may include the ECC unit.

In block 616, the memory control device may transmit the final access data (e.g., final access data 500 in FIG. 5A, corrected access data 510 in FIG. 5B). The memory control device may transmit access data determined to not have any errors in block 612 and/or error corrected access data in optional block 614 as final access data in response to the memory access. The final access data may be transmitted to the component of the computing device from which the memory access request originated. In some embodiments, the memory control device transmitting the final access data in block 616 may include a control circuitry (e.g., control circuitry 104 in FIGS. 1, 3A, 4A, 5A) and/or the ECC unit.

Figure 7A:
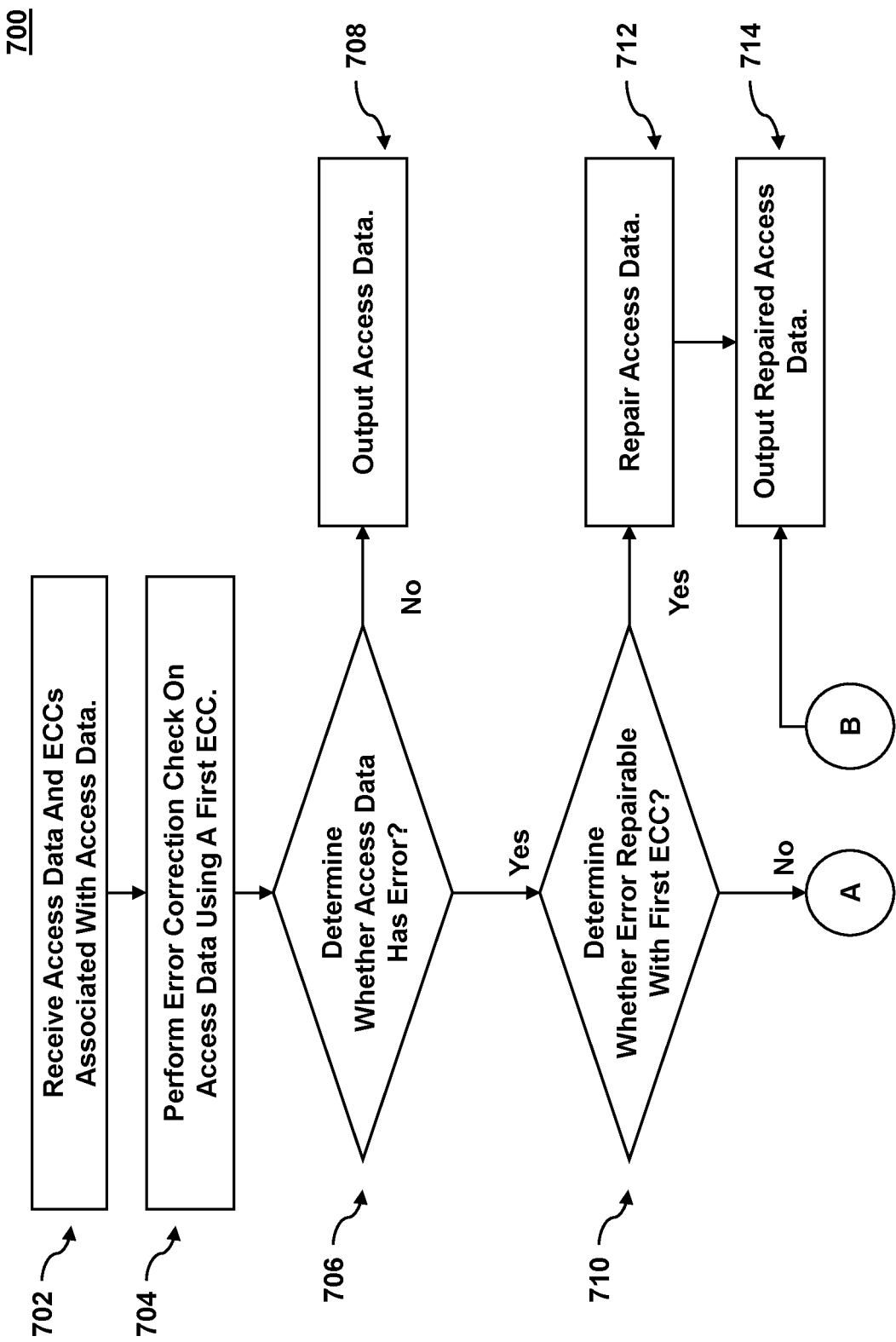
FIGS. 7A and 7B are process flow diagrams of a method of error correction coding with multiple ECC grouping according to an embodiment.
Figure 7B:
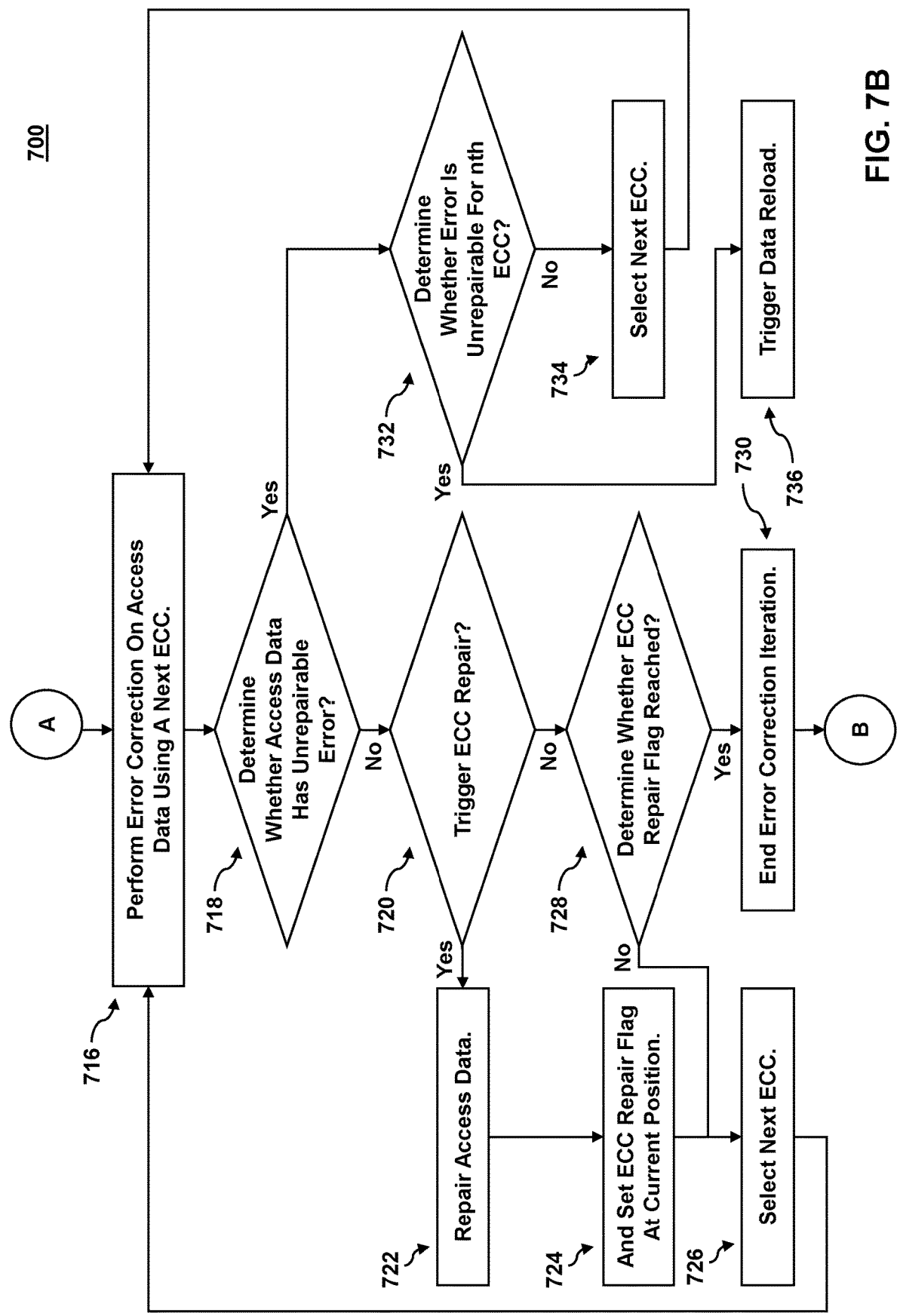

FIGS. 7A and 7B are process flows illustrating steps of a method 700 for performing error correction using ECC groups (e.g., ECC group 412a-412d in FIG. 4B) in accordance with various embodiments. With reference to FIGS. 1-7B, the method 700 may be implemented in software executing in a processor (e.g., ECC unit 108 in FIGS. 1, 2B, 3A, 3C-4A, 4D-5B), in hardware (e.g., ECC unit 108 in FIGS. 1, 2B, 3A, 3C-4A, 4D-5B), or in a combination of a software-configured processor and dedicated hardware, such as a processor executing software within a memory system (e.g., memory system 100 in FIGS. 1, 3A, 4A, 5A) that includes other individual components, and various memory/cache controllers (e.g., control circuitry 104 in FIGS. 1, 3A, 4A, 5A). In order to encompass the alternative configurations enabled in various embodiments, the hardware implementing the method 700 is referred to herein as a "memory control device."

The method 700 is described herein with reference to certain structural elements for purposes of illustration and ease of reference. However, other suitable structural elements are contemplated within the scope of the disclosure for performing the operations of the method 700. One skilled in the art will realize that the illustrated operation of the method 700 is one example, and it should be understood that any of a variety of operations of the method 700 may be omitted, re-sequenced, and/or added while remaining within the scope of the disclosure.

In block 702, the memory control device may receive access data (e.g., access data 310 in FIG. 3A, memory bit 334 in FIGS. 3C, 3D) and ECCs (e.g., ECC 400 in FIG. 4A, ECC 410a-410h in FIG. 4B, ECC 430 in FIGS. 4D, 4E, ECC 442 in FIGS. 4F, 4G) associated with the access data. The access data may be the access data of the decoded column address (e.g., column address 302 in FIGS. 3A, 4A, 4C), corresponding to the column address in block 606 of the method 600 described herein with reference to FIG. 6, and selected from the subset of the data of the activated row (e.g., activation data 308 in FIGS. 3A, 4A) in the activation unit (e.g., activation unit 322 in FIG. 3B, activation unit 331 in FIGS. 3C, 3D, 4B, 4D-4G). The ECCs may be the ECCs corresponding to the column address of the memory access retrieved in block 610 of the method 600 described herein with reference to FIG. 6. The ECCs may be ECCs of an ECC group corresponding to the column address of the memory access. In some embodiments, the memory control device receiving the access data and the ECCs associated with the access data may include an ECC unit (e.g., ECC unit 108 in FIGS. 1, 2B, 3A, 3C-4A, 4D-5B).

In block 704, the memory control device may perform an error correction check on the access data using a first ECC. The first ECC may be one of the ECCs of the ECC group. In some embodiments, the ECC group may include existing ECCs (e.g., ECCs 410a-410d in FIG. 4B, ECC 430 in FIGS. 4D, 4E) and new ECCs (e.g., ECCs 410e-410h, ECC 442 in FIG. 4F. 4G) enabled by the embodiments described herein. The existing ECCs may be limited to ECC bits that are within an access unit (e.g., access unit 320 in FIG. 3B, access unit 332 in FIGS. 3C, 3D, 4D, 4E, access unit 414a-414d in FIG. 4B) of a bit of the memory access. The new ECCs may include any number and combination of bits from the same activation unit (e.g., activation unit 322 in FIG. 3B, activation unit 331 in FIGS. 3C, 3D, 4B, 4D-4G) as the bit of the memory access. In some embodiments, the first ECC may be an existing ECC. The memory control device may use any known error detection means to perform the error correction check on the access data using the first ECC. In some embodiments, the memory control device performing the error correction check on the access data using the first ECC in block 704 may include the ECC unit.

In determination block 706, the memory control device may determine whether the access data has an error. The determination of whether the access data has an error may be a result of the error correction check in block 704. For example, a result of the error correction check that does not equal an expected result or a result configured to indicate that no error exists may indicate to the memory control device that the access data has an error. Similarly, a result of the error correction check that does equal an expected result or a result configured to indicate that no error exists may indicate to the memory control device that the access data does not have an error. In some embodiments, the memory control device determining whether the access data has an error in determination block 706 may include the ECC unit.

In some embodiments, block 704, determination block 706, and block 716 may further describe block 612 of the method 600 described herein with reference to FIG. 6.

In response to determining that the access data does not have an error (i.e., determination block 706="No"), the memory control device may output the access data (e.g., final access data 500 in FIG. 5A) in block 708. The access data may be unaltered by an error correction process. The access data may be a response to a memory access request. The memory control device may transmit the access data to a component, such as a processor or subsystem, of a computing device from which the memory access request originated. In some embodiments, the memory control device may transmit the access data to a component of the computing device, such as control circuitry (e.g., control circuitry 104 in FIGS. 1, 3A, 4A, 5A) of a memory system (e.g., memory system 100 in FIGS. 1, 3A, 4A, 5A), that may subsequently output the access data to the component of the computing device from which the memory access request originated. In some embodiments, the memory control device outputting the access data in block 708 may include the ECC and/or the control circuitry.

In response to determining that the access data has an error (i.e., determination block 706="Yes"), the memory control device may determine whether the error is repairable with the first ECC in determination block 710. The memory control device may attempt to repair the access data using any known error correction means to perform error correction on the access data. For example, the memory control device may use Hamming codes, Hsiao codes, Reed-Solomon codes, Bose-Chaudhuri-Hocquenghem codes, turbo codes, low-density-parity-check codes, etc. The memory control device may use the first ECC to implement the known error correction means. In some embodiments, attempts to repair the access data using the first ECC may fail to produce data that may cause the access data to pass an error correction check, and the memory control device may determine that the error is not repairable with the first ECC. Similarly, the attempts to repair the access data using the first ECC may succeed in producing data that may cause the access data to pass an error correction check, and the memory control device may determine that the error is repairable with the first ECC. In some embodiments, the memory control device determining whether the error is repairable with the first ECC in determination block 710 may include the ECC unit.

In response to determining that the error is repairable with the first ECC (i.e., determination block 710="Yes"), the memory control device may repair the access data in block 712. The memory control device may repair the error of the access data using the first ECC. For example, the memory control device may overwrite a bit (e.g., memory bit 334 in FIGS. 3C, 3D) of the access data with the data that may cause the access data to pass an error correction check. In some embodiments, the data that may cause the access data to pass an error correction check may be generated for the determination of whether the error is repairable with the first ECC in determination block 710. In some embodiments, the memory control device repairing the access data in block 712 may include the ECC unit.

In block 714, the memory control device may output the repaired access data (e.g., final access data 500 in FIG. 5A, corrected access data 510 in FIG. 5B). The access data may be altered by repairing the access data in block 712 to generate the repaired access data. The repaired access data may be a response to the memory access request. The memory control device may transmit the repaired access data to the component, such as the processor or subsystem, of the computing device from which the memory access request originated. In some embodiments, the memory control device may transmit the repaired access data to the component of the computing device, such as the control circuitry of the memory system, that may subsequently output the repaired access data to the component of the computing device from which the memory access request originated. In some embodiments, the memory control device outputting the repaired access data in block 714 may include the ECC and/or the control circuitry.

In response to determining that the error is not repairable with the first ECC (i.e., determination block 710="No"), the memory control device may perform the error correction check on the access data using a next ECC in block 716. The next ECC may be one of the ECCs of the ECC group. In some embodiments, the next ECC may be a new ECC. The memory control device may use any known error detection means to perform the error correction check on the access data using the next ECC. In some embodiments, the memory control device performing the error correction check on the access data using the next ECC in block 716 may include the ECC unit.

In determination block 718, the memory control device may determine whether the access data has an unrepairable error. The memory control device may attempt to repair the access data using any known error correction means to perform error correction on the access data. For example, the memory control device may use Hamming codes, Hsiao codes, Reed-Solomon codes, Bose-Chaudhuri-Hocquenghem codes, turbo codes, low-density-parity-check codes, etc. The memory control device may use the next ECC to implement the known error correction means. In some embodiments, attempts to repair the access data using the next ECC may fail to produce data that may cause the access data to pass an error correction check, and the memory control device may determine that the error is not repairable with the next ECC. Similarly, the attempts to repair the access data using the next ECC may succeed in producing data that may cause the access data to pass an error correction check, and the memory control device may determine that the error is repairable with the next ECC. In some embodiments, a determination that the access data does not have an unrepairable error may be a result of determining that the access data has a repairable error. In some embodiments, a determination that the access data does not have an unrepairable error may be a result of determining that the access data does not have an error. In some embodiments, the memory control device determining whether the access data has an unrepairable error in determination block 718 may include the ECC unit.

In response to determining that the access data has an unrepairable error (i.e., determination block 718="Yes"), the memory control device may determine whether the error is unrepairable for an nth ECC in determination block 732. In some embodiments, the "n" variable for determining the nth ECC may be based on an integer number of ECCs, on a latency requirement of a memory (e.g., memory 102 in FIGS. 1, 2A, 3A, 3B, 4A, 5A, memory device 250 in FIGS. 2B, 3C, 3D, 4D-4G, 5B), a cost to reload the access data, etc. The "n" variable may be used as a threshold value to determine whether the error is unrepairable for an nth ECC. The memory control device may compare a value, of a type that is the same type at the type of the "n" variable, to the "n" variable determine whether determine whether the error is unrepairable for an nth ECC. For example, if the value equals or exceeds the "n" variable, the memory control device may determine that the error is unrepairable for the nth ECC. If the value falls short of the "n" variable, the memory control device may determine that the error is not unrepairable for the nth ECC. In some embodiments, the memory control device determining whether the error is unrepairable for the nth ECC in determination block 732 may include the ECC unit.

In response to determining that the error is not unrepairable for the nth ECC (i.e., determination block 732="No"), the memory control device may select a next ECC. The memory control device may select a successive next ECC of the ECC group. The memory control device may select the successive next ECCs of the ECC group in any order. For example, the memory control device may linearly iterate through ECCs of the ECC group. For another example, the memory control device may nonlinearly iterate through ECCs of the ECC group. In some embodiments, the memory control device may select the successive next ECC from the ECCs of the ECC group that have not yet been used to attempt to repair the error in the access data. In some embodiments, the memory control device selecting the next ECC in block 734 may be the ECC unit. The memory control device may perform the error correction on the access data using the next ECC in block 716, as described herein.

In response to determining that the error is unrepairable for the nth ECC (i.e., determination block 732="Yes"), the memory control device may trigger a data reload in block 736. The data in the memory subject to the memory access request may be stored on a lower-level memory (e.g., flash storage memory device, disk storage memory device, etc.) and loaded to the memory from the lower-level memory. When access data is corrupted and unrepairable, the correct access data may be recovered from the lower-level memory by reloading the access data to the memory. In some embodiments, triggering a data reload may include triggering the memory control device to retrieve the access data from the lower-level memory and store the access data to the memory. In some embodiments, the memory control device triggering the data reload in block 736 may include the ECC unit and/or the control circuitry.

In response to determining that the access data does not have an unrepairable error (i.e., determination block 718="No"), the memory control device may control triggering ECC repair in determination block 720. In some embodiments, the access data may have an error that is repairable and may trigger the ECC repair for the repairable error (i.e., determination block 720="Yes"). In some embodiments, the access data may not have an error, therefore not have an error that is unrepairable, and may not trigger the ECC repair (i.e., determination block 720="No"). In some embodiments, the memory control device controlling triggering the ECC repair in determination block 720 may include the ECC unit.

In response to triggering the ECC repair (i.e., determination block 720="Yes"), the memory control device may repair the access data in block 722. The memory control device may repair the error of the access data using the next ECC. For example, the memory control device may overwrite the bit of the access data with the data that may cause the access data to pass an error correction check. In some embodiments, the data that may cause the access data to pass an error correction check may be generated for the determination of whether the error is repairable with the next ECC in determination block 718. In some embodiments, the memory control device repairing the access data in block 722 may include the ECC unit.

In block 724, the memory control device may set an ECC repair flag at a current ECC repair flag position. The ECC repair flag may be configured to indicate to the memory control device that an error in the access data is repaired with the next ECC. In some embodiments, the ECC repair flag position may be a position in a register or other memory integral to and/or accessible by the memory control device. Setting the ECC repair flag at the ECC repair flag position may indicate to the memory control device that an error at the bit of the access data associated by with the ECC repair flag position is repaired. In some embodiments, the ECC repair flag position may be associated with a position of the repaired bit in the access data. In some embodiments, the ECC repair flag position may be associated with a position of the next ECC in the ECC group. Setting the ECC repair flag at the ECC repair flag position may indicate to the memory control device that an error in the access data repaired using the next ECC associated by with the ECC repair flag position. In some embodiments, the ECC repair flag for the ECC repair flag position associated with the first ECC of the ECC group may be preset. In some embodiments, the memory control device setting the ECC repair flag position in block 724 may be the ECC unit.

In block 726, the memory control device may select a next ECC. The memory control device may select a successive next ECC of the ECC group. The memory control device may select the successive next ECCs of the ECC group in any order. For example, the memory control device may linearly iterate through ECCs of the ECC group. For another example, the memory control device may nonlinearly iterate through ECCs of the ECC group. In some embodiments, the memory control device may select the successive next ECC from the ECCs of the ECC group that have not yet been used to repair the error in the access data. The memory control device may determine whether an ECC has been used to repair the error in the access data, for example, by checking whether the ECC repair flag is set at a ECC repair flag position associated with the ECC in the ECC group. In response to the ECC repair flag being set at the ECC repair flag position associated with the ECC in the ECC group, the memory control device may attempt to select another ECC in the ECC group. In response to the ECC repair flag not being set at the ECC repair flag position associated with the ECC in the ECC group, the memory control device may select the ECC as the next ECC. In some embodiments, the memory control device selecting the next ECC in block 726 may be the ECC unit. The memory control device may perform the error correction on the access data using the next ECC in block 716, as described herein.

In response to determining not to trigger the ECC repair (i.e., determination block 720="No"), the memory control device may determine whether the ECC repair flag is reached in determination block 728. In some embodiments, the memory control device may check the ECC repair flag position associated with the bit of the access data associated with the ECC repair flag position for which the error is found and determine whether the error flag is set. In some embodiments, the memory control device may check the ECC repair flag position associated with the next ECC and determine whether the error ECC flag is set. The memory control device may determine whether the ECC repair flag is set by checking for a designated value, such as a logical true "1" value. In some embodiments, the memory control device determining whether the ECC repair flag is reached in determination block 728 may include the ECC unit.

In response to determining that the ECC repair flag is not reached (i.e., determination block 728="No"), the memory control device may select a next ECC in block 726 as described herein.

In response to determining that the ECC repair flag is reached (i.e., determination block 728="Yes"), the memory control device may end an iteration of error correction in block 730. The iteration of error correction may include using the ECCs of the ECC group to detect and/or correct the error in the access data. The memory control device ending the iteration of error control in block 730 may include the ECC unit. The memory control device may output the repaired access data in block 714.

In some embodiments, any combination of determination block 710, block 712, determination block 718, determination block 720, block 722, block 724, block 726, determination block 728, and block 730 may further describe optional block 614 of the method 600 described herein with reference to FIG. 6.

Figure 8:
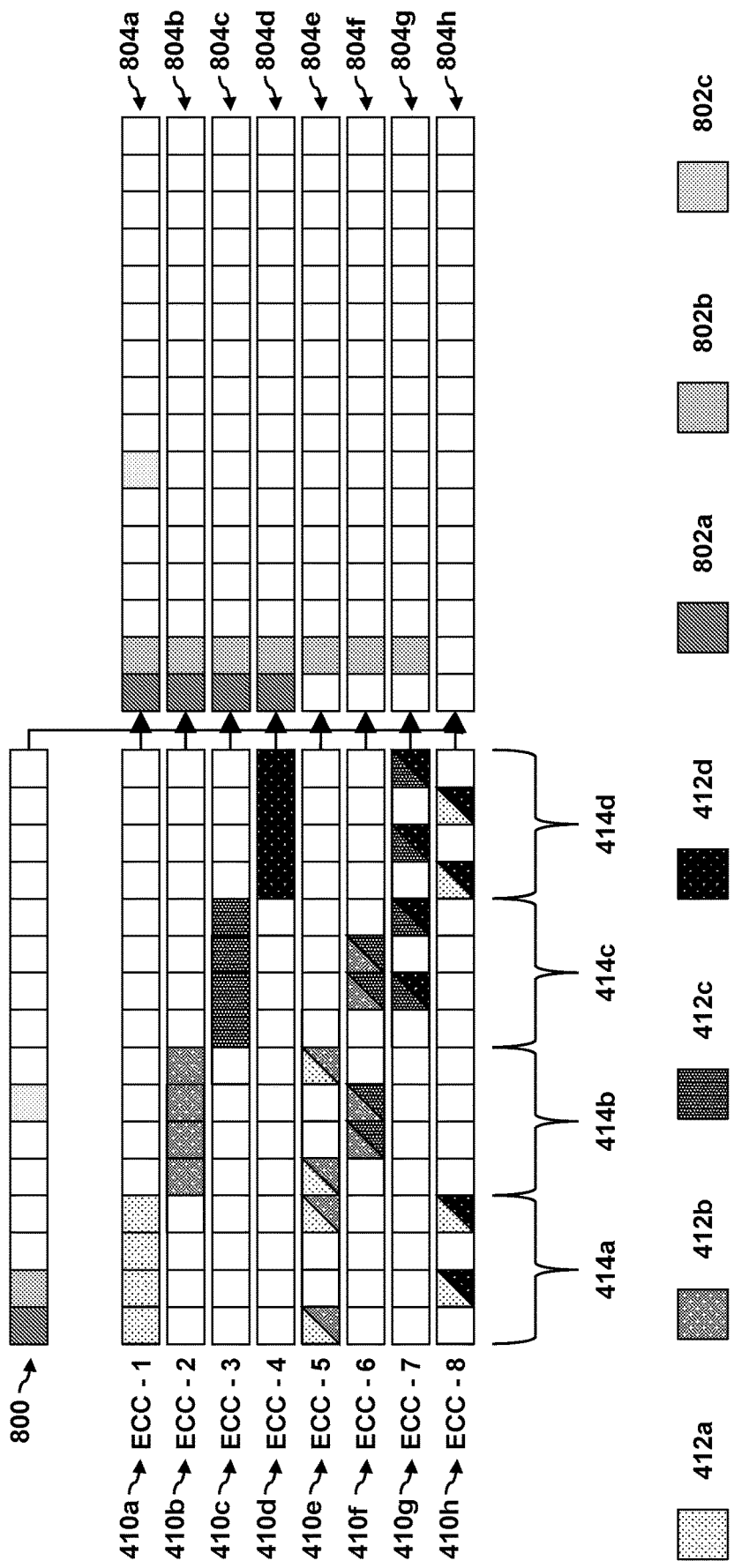
FIG. 8 is a block diagram of ECC group application to error bits suitable for implementing various embodiments.

FIG. 8 is a diagram illustrating an example of ECC group application to error bits 802a, 802b, 802c suitable for implementing various embodiments. With reference to FIGS. 1-8, using the example illustrated in FIG. 4B, the example illustrated in FIG. 8 shows ECC groups 412a-412d including multiple ECCs 410a-410h applied to error bits 802a, 802b, 802c of data 800 for error checking and correction. Each error bit 802a, 802b, 802c is shaded with a different shade in FIG. 8 and presence of the shading may indicate presence of an error, while absence of the shading in the same bit location may indicate absence of an error. Absence of an error for a bit location that previously had a present error may be caused by successful error correction using an ECCs 410a-410h. The error bits 802a, 802b may be within the access unit 414a and the error bit 802c may be within the access unit 414b. ECCs 410a-410h that have bits in a corresponding access unit 414a-414d to an error bit 802a-802c may be applied to the error bits 802a-802c within the corresponding access unit 414a-414d. In the example illustrated in FIG. 8, ECC-1 410a, ECC-5 410e, and ECC-8 410h of an ECC group 412a may be applied to the error bits 802a, 802b in the access unit 414a. ECC-2 410b, ECC-5 410e, and ECC-6 410f of an ECC group 412b may be applied to the error bit 802c in the access unit 414b. The remaining ECCs 410c, 410d, 410g may not be applicable to the error bits 802a-802c in the access units 414a, 414b.

The ECC-1 410a may be applied to the error bits 802a, 802b but may not correct the errors of the error bits 802a, 802b in error checked data 804a. The ECC-1 410a may not be applicable to the error bit 802c in error checked data 804a. The ECC-2 410b may be applied to the error bit 802c and may correct the error of the error bit 802c in error checked data 804b. The ECC-2 410b may not be applicable to the error bits 802a, 802b in error checked data 804b. The ECC-3 410c may not be applicable to the error bits 802a-802c in error checked data 804c. The ECC-4 410d may not be applicable to the error bits 802a-802c in error checked data 804d. The ECC-5 410e may be applied to the error bits 802a, 802b and correct the error of the error bit 802a but may not correct the error of the error bit 802b in error checked data 804e. The ECC-5 410e may be applied to the error bit 802c and may find no error in error checked data 804e as the error may have been previously been corrected using ECC-2 410b. The ECC-6 410f may not be applicable to the error bits 802a, 802b in error checked data 804f. The ECC-6 410f may be applied to the error bit 802c and may find no error in error checked data 804f as the error may have been previously been corrected using ECC-2 410b. The ECC-7 410*g* may not be applicable to the error bits 802*a*-802*c* in error checked data 804*g*. The ECC-8 410*h* may be applied to the error bit 802*b* and correct the error of the error bit 802*b* in error checked data 804*h*. The ECC-8 410*h* may be applied to the error bit 802*a* and may find no error in error checked data 804*h* as the error may have been previously been corrected using ECC-5 410*e*. The ECC-8 410*h* may not be applicable to the error bit 802*c* in error checked data 804*h*. In some embodiments, an ECC 410*a*-410*h* may be flagged, such as described for block 724 of the method 700 with reference to FIG. 7B, in response to the ECC 410*a*-410*h* being used to attempt to repair an error bit 802*a*-802*c*. In this example, ECC-1 410*a*, ECC-2 410*b*, ECC-5 410*e*, and ECC-8 410*h* may be flagged.

Figure 9:
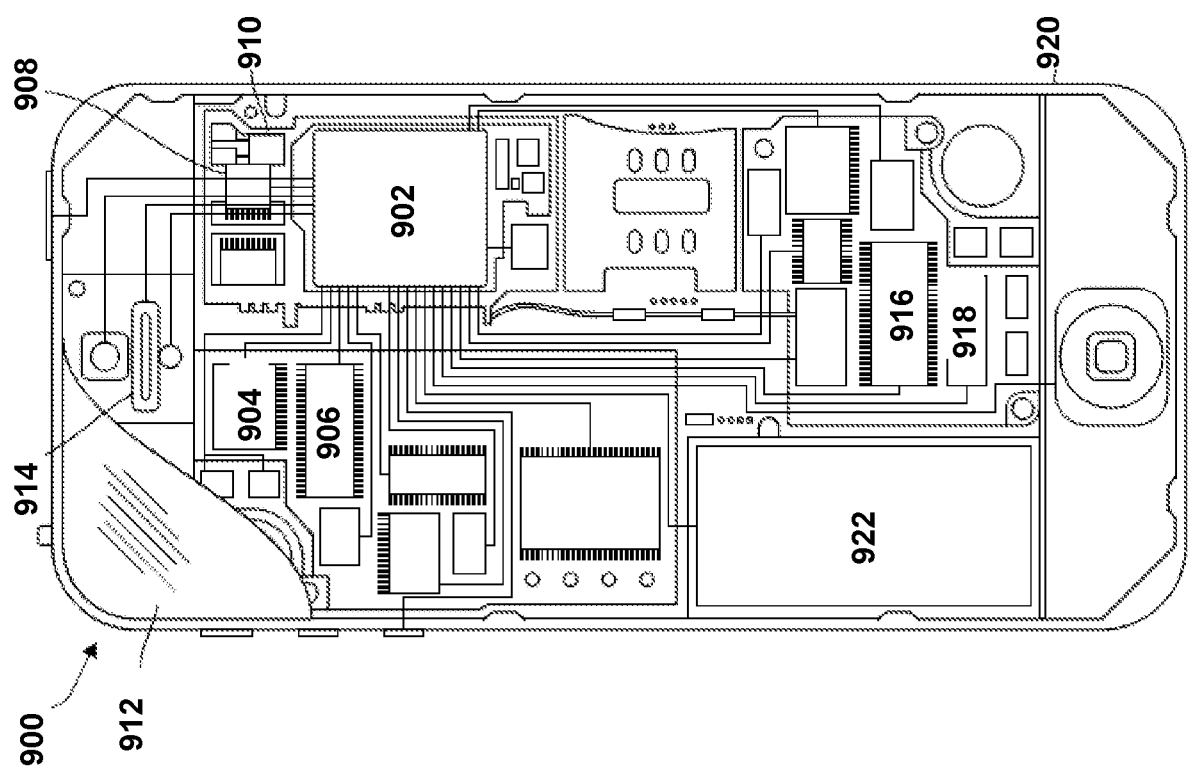
FIG. 9 is a component block diagram of an example mobile computing device suitable for use with the various embodiments.

Various examples (including, but not limited to, the examples discussed above with reference to FIGS. 1-8) may be implemented in any of a variety of computing devices, an example 900 of which is illustrated in FIG. 9. With reference to FIGS. 1-5B, the wireless device 900 may include a processor 902 coupled to a touchscreen controller 904 and an internal memory 906 (e.g., memory system 100 in FIGS. 1, 3A, 4A, 5A, memory 102 in FIGS. 1, 2A, 3A, 3B, 4A, 5A, memory device 250 in FIGS. 2B, 3C, 3D, 4D-4G, 5B). The processor 902 may be one or more multicore ICs designated for general or specific processing tasks. The internal memory 906 may be volatile or non-volatile memory and may also be secure and/or encrypted memory, or unsecure and/or unencrypted memory, or any combination thereof.

The touchscreen controller 904 and the processor 902 may also be coupled to a touchscreen panel 912, such as a resistive-sensing touchscreen, capacitive-sensing touchscreen, infrared sensing touchscreen, etc. The wireless device 900 may have one or more radio signal transceivers 908 (e.g., Peanut®, Bluetooth®, Zigbee®, Wi-Fi, RF radio) and antennas 910, for sending and receiving, coupled to each other and/or to the processor 902. The transceivers 908 and antennas 910 may be used with the above-mentioned circuitry to implement the various wireless transmission protocol stacks and interfaces. The wireless device 900 may include a cellular network wireless modem chip 916 that enables communication via a cellular network and is coupled to the processor.

The wireless device 900 may include a peripheral device connection interface 918 coupled to the processor 902. The peripheral device connection interface 918 may be singularly configured to accept one type of connection, or multiply configured to accept various types of physical and communication connections, common or proprietary, such as USB, FireWire, Thunderbolt, or PCIe. The peripheral device connection interface 918 may also be coupled to a similarly configured peripheral device connection port (not shown). The wireless device 900 may also include speakers 914 for providing audio outputs. The wireless device 900 may also include a housing 920, constructed of a plastic, metal, or a combination of materials, for containing all or some of the components discussed herein. The wireless device 900 may include a power source 922 coupled to the processor 902, such as a disposable or rechargeable battery. The rechargeable battery may also be coupled to the peripheral device connection port to receive a charging current from a source external to the wireless device 900.

Figure 10:
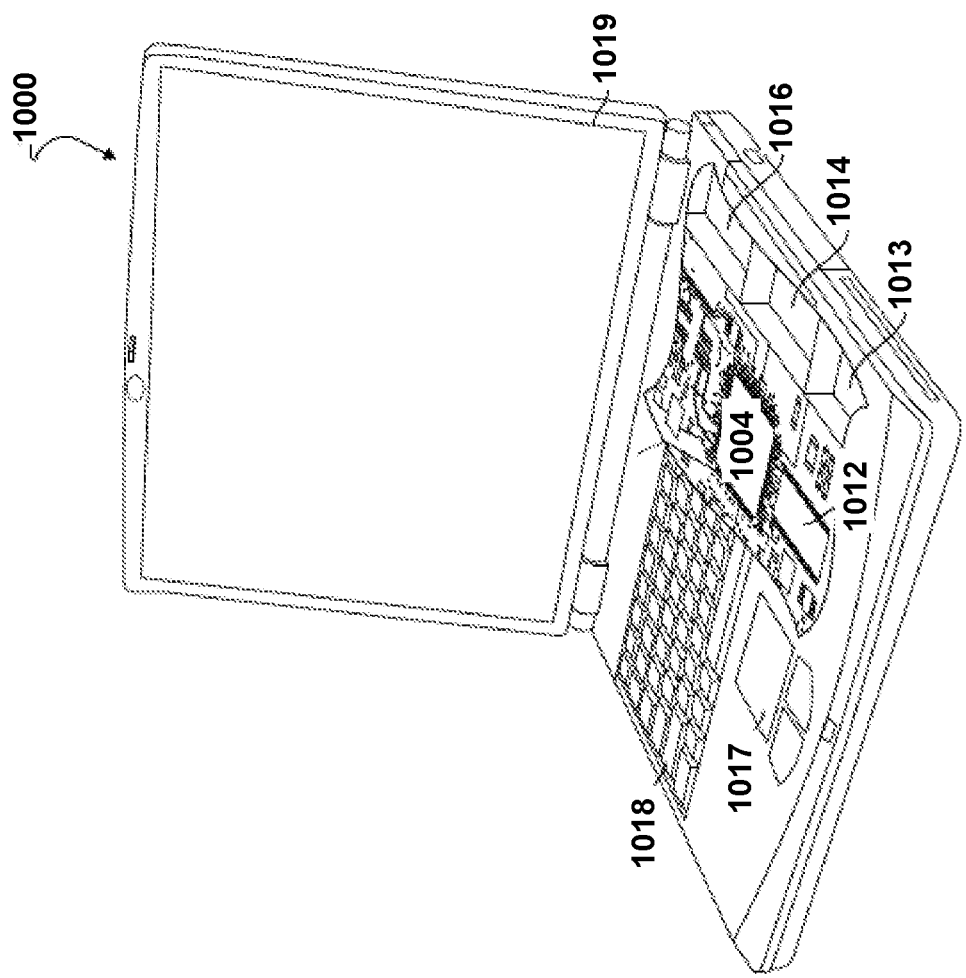
FIG. 10 is a component block diagram of an example computing device suitable for use with the various embodiments.

Various examples (including, but not limited to, the examples discussed above with reference to FIGS. 1-8), may also be implemented within a variety of personal computing devices, an example 1000 of which is illustrated in FIG. 10. With reference to FIGS. 1-8, the laptop computer 1000 may include a touchpad touch surface 1017 that serves as the computer's pointing device, and thus may receive drag, scroll, and flick gestures similar to those implemented on wireless computing devices equipped with a touchscreen display and described above. A laptop computer 1000 will typically include a processor 1004 coupled to volatile memory 1012 (e.g., memory system 100 in FIGS. 1, 3A, 4A, 5A, memory 102 in FIGS. 1, 2A, 3A, 3B, 4A, 5A, memory device 250 in FIGS. 2B, 3C, 3D, 4D-4G, 5B) and a large capacity nonvolatile memory, such as a disk drive 1013 of Flash memory. The computer 1000 may also include a floppy disc drive 1014 and a compact disc (CD) drive 1016 coupled to the processor 1004. The computer 1000 may also include a number of connector ports coupled to the processor 1004 for establishing data connections or receiving external memory devices, such as a Universal Serial Bus (USB) or FireWire® connector sockets, or other network connection circuits for coupling the processor 1004 to a network. In a notebook configuration, the computer housing includes the touchpad 1017, the keyboard 1018, and the display 1019 all coupled to the processor 1004. Other configurations of the computing device may include a computer mouse or trackball coupled to the processor (e.g., via a USB input) as are well known, which may also be used in conjunction with various examples.

Figure 11:
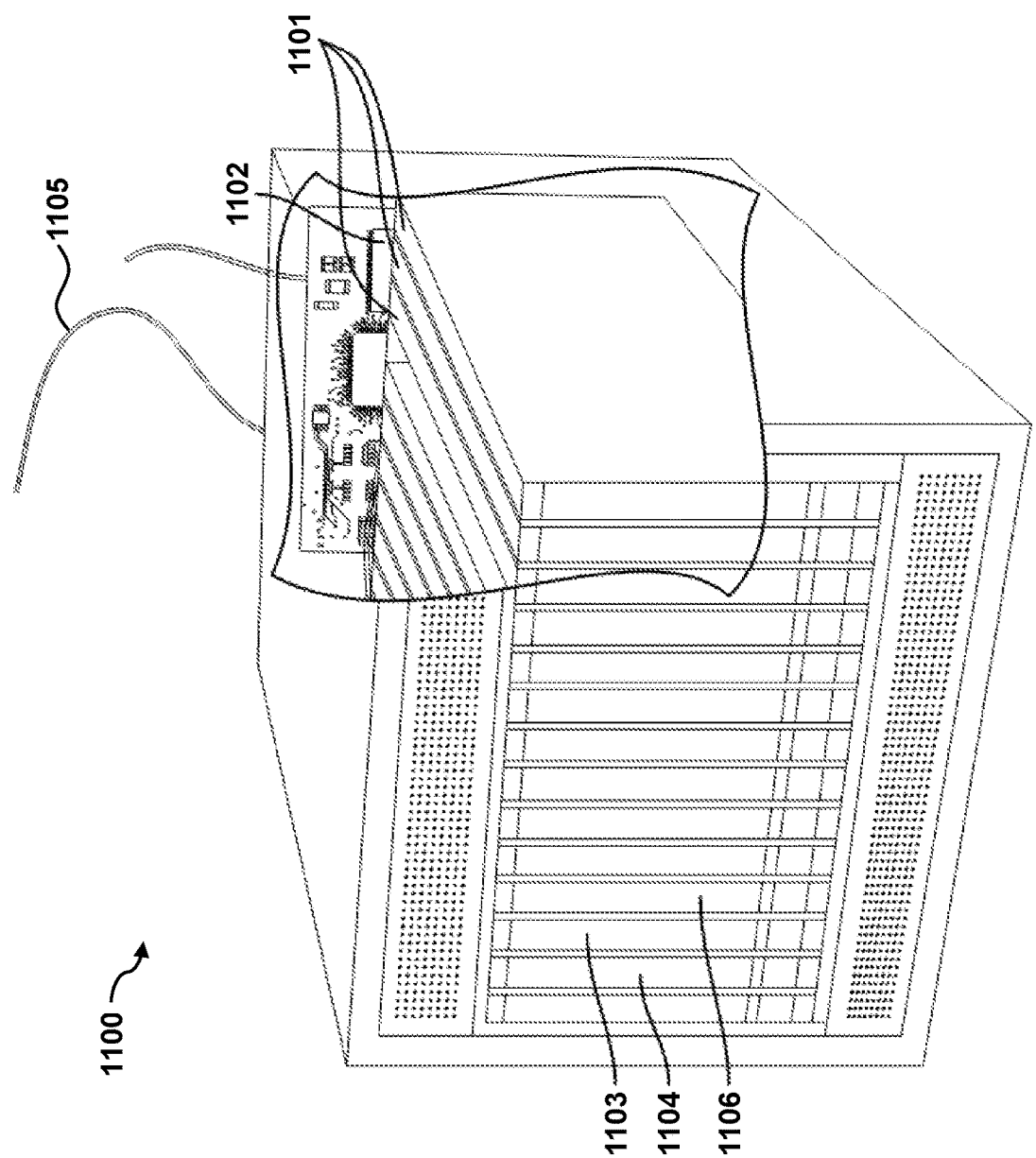
FIG. 11 is a component block diagram illustrating an example server suitable for use with the various embodiments.

Various examples (including, but not limited to, the examples discussed above with reference to FIGS. 1-8) may also be implemented in fixed computing systems, such as any of a variety of commercially available servers. An example server 1100 is illustrated in FIG. 11. Such a server 1100 typically includes one or more multicore processor assemblies 1101 coupled to volatile memory 1102 (e.g., memory system 100 in FIGS. 1, 3A, 4A, 5A, memory 102 in FIGS. 1, 2A, 3A, 3B, 4A, 5A, memory device 250 in FIGS. 2B, 3C, 3D, 4D-4G, 5B) and a large capacity nonvolatile memory, such as a disk drive 1104. As illustrated in FIG. 11, multicore processor assemblies 1101 may be added to the server 1100 by inserting them into the racks of the assembly. The server 1100 may also include a floppy disc drive, compact disc (CD) or digital versatile disc (DVD) disc drive 1106 coupled to the processor 1101. The server 1100 may also include network access ports 1103 coupled to the multicore processor assemblies 1101 for establishing network interface connections with a network 1105, such as a local area network coupled to other broadcast system computers and servers, the Internet, the public switched telephone network, and/or a cellular data network.

With reference to FIGS. 1-8, the processors 902, 1004, 1101 may be any programmable microprocessor, microcomputer or multiple processor chip or chips that can be configured by software instructions (applications) to perform a variety of functions, including the functions of various examples described above. In some devices, multiple processors may be provided, such as one processor dedicated to wireless communication functions and one processor dedicated to running other applications. Typically, software applications may be stored in the internal memory 906, 1012, 1013, 1102 before they are accessed and loaded into the processors 902, 1004, 1101. The processors 902, 1004, 1101 may include internal memory sufficient to store the application software instructions. In many devices the internal memory 906, 1012, 1013, 1102 may be a volatile or nonvolatile memory, such as flash memory, or a mixture of both. For the purposes of this description, a general reference to memory refers to memory accessible by the processors 902, 1004, 1101, including internal memory 906, 1012, 1013, 1102 or removable memory plugged into the device and memory 906, 1012, 1102 within the processors 902, 1004, 1101, themselves.

Referring collectively to FIGS. 1-8, a method for error correction in a memory system is provided. The method may include the operations of: receiving, from a row buffer 212 of a memory 102, an access data 310 corresponding to a column address 302 of a memory access, wherein the row buffer 212 has data of an activation unit 322, 331 of the memory 102 corresponding to a row address 304 of the memory access; determining multiple error correction codes (ECCs) 410 for the access data 310 using the column address 302; and checking the access data 310 for an error utilizing at least one of the multiple ECCs 410.

In an embodiment, the method may further include the operation of correcting the error in the access data 310 utilizing the at least one of the multiple ECCs 410. In another embodiment, determining the multiple ECCs 410 for the access data 310 using the column address 302 may include the operations of: executing an ECC group function 420; and generating a result of the ECC group function 420 configured to indicate the multiple ECCs 410 associated with the column address 302 from among a larger multiple of ECCs 400. In an embodiment method, executing the ECC group function 420 may include the operation of executing multiple hash functions using the column address 302, wherein each of the multiple hash functions is associated with a different one of the multiple ECCs 410; and the operation of generating the result of the ECC group function 420 may include the operation of generating a hash array for which a result of each of the multiple hash functions is associated with a position of multiple positions in the hash array and each of the multiple position is associated with one of the multiple ECCs 410.

In an embodiment, the multiple ECCs 410 may include: a first ECC having data from an access unit 332 of the memory 102 corresponding with the column address 302; and at least one second ECC having data from the access unit 332 and data from the activation unit 322, 331 other than from the access unit 332. In one embodiment, checking the access data for an error utilizing the at least one of the multiple ECCs 410 may include the operation of determining whether the access data has an error using the first ECC, and the method for error correction may further include the operations of: determining whether the error is correctable using the first ECC in response to determining that the access data has an error using the first ECC; determining whether the access data has an error using the second ECC in response to determining that the error is not correctable using the first ECC; and determining whether the error is correctable using the second ECC in response to determining that the access data has an error using the second ECC.

In one embodiment, checking the access data for an error utilizing the at least one of the multiple ECCs may further include the operation of checking the access data for errors utilizing the second ECC, and the method for error correction may further include the operations of: correcting the error of the access data using the second ECC generating a final access data; and outputting the final access data to a component of a computing device from which a memory access request triggered the memory access.

Referring collectively to FIGS. 1-8, another embodiment method for error correction in a memory system is provided. The embodiment method may include the operations of: determining multiple error correction codes (ECCs) 410 for an access data at a column address 302 of a memory including a first ECC and at least one second ECC, wherein the first ECC has data from an access unit subset 332 of an activation unit 322, 331 of the memory, and wherein the at least one second ECC has a data from the access unit 332 and a data from the activation unit 322, 331 other than from the access unit 332; and attempting to correct an error in the access data using the at least one second ECC.

In an embodiment, determining the multiple error correction codes for the access data may further include the operations of: receiving the column address 302 as an input to an ECC group function 420; executing the ECC group function 420; and generating a result of the ECC group function 420 configured to indicate the multiple ECCs 410 associated with the column address from among a larger multiple of ECCs 400.

In an embodiment, the operation of executing the ECC group function 420 may further include the operation of executing multiple hash functions using the column address, wherein each of the multiple hash functions is associated with a different one of the multiple ECCs 410; and the operation of generating the result of the ECC group function 420 may include the operation of generating a hash array for which a result of each of the multiple hash functions is associated with a position of multiple positions in the hash array and each of the multiple position is associated with one of the multiple ECCs 410.

In an embodiment, the operation of determining the multiple ECCs for the access data 310 may include the operation of determining column addresses 302 for each bit of the at least one second ECC, and the embodiment method may further include the operation of retrieving the at least one second ECC from the memory using the determined column addresses.

In an embodiment, the multiple ECCs 410 may include multiple second EECs including a third ECC and a fourth ECC, wherein the at least one second ECC is the third ECC, and the operation of attempting to correct the error in the access data using the at least one second ECC may include the operation of attempting to correct the error in the access data 310 using the third ECC, and the embodiment method of error correction in a memory system may further include the operation of attempting to correct the error in the access data using the fourth ECC following failure to correct the error in the access data using the third ECC.

In one embodiment, the method may further include the operations of: determining whether the error in the access data 310 is repairable using the at least one second ECC, wherein attempting to correct the error in the access data using the at least one second ECC occurs in response to determining that the error in the access data is repairable using the at least one second ECC; and triggering a data reload for the access data in response to determining that the error in the access data is not repairable using the at least one second ECC.

In an embodiment, the method of error correcting in a memory system may further include the operation of determining whether the error is unrepairable for an nth ECC, in which triggering the data reload for the access data occurs in response to determining that the error is unrepairable for an nth ECC.

Referring collectively to FIGS. 1-11, a memory system is provided. The memory system may include: an input/output (I/O) circuitry 106; and an error correction code (ECC) unit 108 to the I/O circuitry 106, wherein: the I/O circuitry 106 is configured to implement operations including the operations of: determining multiple error correction codes (ECCs) 400 for an access data at a column address 302 of a memory access; transmitting the access data to the EEC unit 108; and transmitting the multiple ECCs 400 to the ECC unit 108; the ECC unit 108 is configured to implement operations including: determining whether an error in the access data is repairable with at least one of the multiple ECCs 400; and correcting the error in the access data in response to determining that the error in the access data is repairable with the at least one of the multiple ECCs 400.

In an embodiment memory system, the I/O circuitry 106 may be configured to implement operations such that determining multiple ECCs 400 include the operations of: determining a first ECC having data from an access unit subset 332 of an activation unit 322. 331 of a memory subject to the memory access; and determining a second ECC having a data from the access unit 332 and a data from the activation unit 322, 331 other than from the access unit 332.

In one embodiment memory system, the I/O circuitry 106 may be configured to implement operations such that determining multiple ECCs 400 includes the operations of: receiving the column address 302 as an input to an ECC group function 420; executing the ECC group function 420; and generating a result of the ECC group function 420 configured to indicate the multiple ECCs 410 associated with the column address 302 from among a larger multiple of ECCs.

In one embodiment memory system, the I/O circuitry 106 may be configured to implement operations such that: executing the ECC group function 420 comprises executing multiple hash functions using the column address 302, wherein each of the multiple hash functions is associated with a different one of the multiple ECCs 410; and generating the result of the ECC group function 420 comprises generating a hash array for which a result of each of the multiple hash functions is associated with a position of multiple positions in the hash array and each of the multiple position is associated with one of the multiple ECCs.

In another embodiment memory system, the ECC unit 108 may be configured to implement operations such that determining whether the error in the access data 310 is repairable with the at least one of the multiple ECCs 410 comprises determining whether the error in the access data is repairable with a first ECC of the multiple ECCs 410; and the ECC unit 108 may be configured to implement operations further comprising selecting a second ECC of the multiple ECCs 410 in response to determining that the error in the access data is not repairable with the first ECC, wherein determining whether the error in the access data is repairable with the at least one of the multiple ECCs 410 may further include the operation of: determining whether the error in the access data is repairable with the second ECC, and wherein correcting the error in the access data may include the operation of correcting the error in the access data using the second EEC in response to determining that the error in the access data is repairable with the second ECCs.

In another embodiment memory system, the I/O circuitry 106 may include a bitline decoder 256, wherein the bitline decoder 256 is configured to implement operations including determining the ECCs 410 for the access data 310 at the column address 302 of the memory access.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

While the terms "first" and "second" are used herein to describe data transmission associated with a SIM and data receiving associated with a different SIM, such identifiers are merely for convenience and are not meant to limit the various examples to a particular order, sequence, type of network or carrier.

The various illustrative logical blocks, processes, circuits, and algorithm steps described in connection with the examples disclosed herein may be implemented as electronic hardware, computer software, or combinations of both. To clearly illustrate this interchangeability of hardware and software, various illustrative components, blocks, processes, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, processes, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module, which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers.

Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. Thus, the present invention is not intended to be limited to the examples shown herein but is to be accorded the widest scope consistent with the following claims and the principles and novel features disclosed herein.

As described herein, one skilled in the art will realize that examples of dimensions are approximate values and may vary by +/−5.0%, as required by manufacturing, fabrication, and design tolerances.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for error correction in a memory system, comprising:
    generating a representation of multiple error correction codes (ECCs) of an ECC group that are associated with an access data from a memory, wherein the ECC group is associated with an activation unit of the memory having the access data; and
    checking the access data for an error utilizing at least one of the multiple ECCs.

2. The method of claim 1, wherein generating the representation of the multiple ECCs of the ECC group that are associated with the access data from the memory comprises generating the representation of the multiple ECCs using a column address of a memory access corresponding to the access data.

3. The method of claim 1, wherein generating the representation of the multiple ECCs of the ECC group that are associated with the access data from the memory comprises:
    executing an ECC group function; and
    generating a result of the ECC group function configured to indicate the multiple ECCs associated with the access data from among a larger multiple of ECCs.

4. The method of claim 3, wherein:
    executing the ECC group function comprises executing multiple hash functions using a column address of a memory access corresponding to the access data, wherein each of the multiple hash functions is associated with a different one of the multiple ECCs; and
    generating the result of the ECC group function comprises generating a hash array for which a result of each of the multiple hash functions is associated with a position of multiple positions in the hash array and each of the multiple position is associated with one of the multiple ECCs.

5. The method of claim 1, wherein the multiple ECCs includes:
    a first ECC having data from an access unit of the memory corresponding with using a column address of a memory access corresponding to the access data; and
    at least one second ECC having data from the access unit and data from the activation unit other than from the access unit.

6. The method of claim 5, wherein checking the access data for an error utilizing the at least one of the multiple ECCs comprises determining whether the access data has an error using the first ECC,
    the method further comprising:
        determining whether the error is correctable using the first ECC in response to determining that the access data has an error using the first ECC;
        determining whether the access data has an error using the second ECC in response to determining that the error is not correctable using the first ECC; and
        determining whether the error is correctable using the second ECC in response to determining that the access data has an error using the second ECC.

7. The method of claim 5, wherein checking the access data for an error utilizing the at least one of the multiple ECCs comprises checking the access data for an error utilizing the second ECC, the method further comprising:
    correcting the error of the access data using the second ECC generating a final access data; and
    outputting the final access data to a component of a computing device from which a memory access request triggered the memory access.

8. A method for error correction in a memory system, comprising:
    determining multiple error correction codes (ECCs) having data from an activation unit of a memory, wherein at least one of the multiple ECCs has a data from an activation unit of a memory other than from an access unit subset of the activation unit having an access data; and
    checking for an error in the access data using the at least one of the multiple ECCs.

9. The method of claim 8, wherein the multiple ECCs include a first ECC and at least one second ECC, wherein the first ECC has data from an access unit, and wherein the at least one second ECC is the at least one of the multiple ECCs having a data from the access unit and the data from the activation unit other than from the access unit.

10. The method of claim 8, wherein determining the multiple ECCs comprises:
    executing an ECC group function; and
    generating a result of the ECC group function configured to indicate the multiple ECCs associated with the access data from among a larger multiple of ECCs.

11. The method of claim 10, wherein:
    executing the ECC group function comprises executing multiple hash functions using a column address of a memory access corresponding to the access data, wherein each of the multiple hash functions is associated with a different one of the multiple ECCs; and
    generating the result of the ECC group function comprises generating a hash array for which a result of each of the multiple hash functions is associated with a position of multiple positions in the hash array and each of the multiple position is associated with one of the multiple ECCs.

12. The method of claim 8, wherein determining the multiple ECCs comprises determining column addresses for each bit of the at least one of the multiple ECCs, and
the method further comprises retrieving the at least one of the multiple ECCs from the memory using the determined column addresses.

13. The method of claim 8, further comprising attempting to correct the error in the access data using the at least one of the multiple ECCs.

14. The method of claim 13, wherein:
the at least one of the multiple ECCs includes a first ECC and a second ECC, and
attempting to correct the error in the access data using the at least one of the multiple ECCs comprises attempting to correct the error in the access data using the first ECC,
the method further comprising attempting to correct the error in the access data using the second ECC following failure to correct the error in the access data using the first ECC.

15. The method of claim 13, further comprising:
determining whether the error in the access data is repairable using the at least one of the multiple ECCs, wherein attempting to correct the error in the access data using the at least one of the multiple ECCs occurs in response to determining that the error in the access data is repairable using the at least one of the multiple ECCs; and
triggering a data reload for the access data in response to determining that the error in the access data is not repairable using the at least one of the multiple ECCs.

16. The method of claim 15, further comprising determining whether the error is unrepairable for an nth ECC of the multiple ECCs, wherein triggering the data reload for the access data occurs in response to determining that the error is unrepairable for the nth ECC.

17. A method for error correction in a memory system, comprising:
iteratively checking for an error in an access data from an activation unit of a memory using a different one of multiple error correction codes (ECCs) per iteration, wherein at least one of the multiple ECCs has a data from an access unit of the activation unit other than from an access unit having the access data.

18. The method of claim 17, wherein:
the different one of multiple ECCs per iteration includes a first ECC for a first iteration and the at least of the multiple ECCs including a second ECC for a second iteration, and
iteratively checking for an error in the access data from the activation unit of the memory using the different one of multiple ECCs per iteration comprises:
determining whether the access data has the error using the second ECC; and
determining whether the error is correctable using the second ECC in response to determining that the access data has an error using the second ECC.

19. The method of claim 18, wherein iteratively checking for an error in the access data from the activation unit of the memory using the different one of multiple ECCs per iteration further comprises:
determining whether the access data has an error using the first ECC; and
determining whether the error is correctable using the first ECC in response to determining that the access data has an error using the first ECC, wherein determining whether the access data has the error using the second ECC comprises determining whether the access data has the error using the second ECC in response to determining that the error is not correctable using the first ECC.

20. The method of claim 18, further comprising attempting to correct the error in the access data using the second ECC.

* * * * *